(12) United States Patent
Hung et al.

(10) Patent No.: US 7,420,837 B2
(45) Date of Patent: Sep. 2, 2008

(54) METHOD FOR SWITCHING MAGNETIC MOMENT IN MAGNETORESISTIVE RANDOM ACCESS MEMORY WITH LOW CURRENT

(75) Inventors: Chien-Chung Hung, Hsinchu (TW); Ming-Jer Kao, Hsinchu (TW); Yuan-Jen Lee, Hsinchu (TW); Lien-Chang Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 122 days.

(21) Appl. No.: 11/338,653

(22) Filed: Jan. 25, 2006

(65) Prior Publication Data
US 2007/0030727 A1 Feb. 8, 2007

Related U.S. Application Data

(60) Provisional application No. 60/704,885, filed on Aug. 3, 2005.

(51) Int. Cl.
*G11C 11/00* (2006.01)
(52) U.S. Cl. .................. 365/158; 365/171; 365/173
(58) Field of Classification Search ............ 365/158, 365/171, 173; 257/421, 427; 438/3
See application file for complete search history.

(56) References Cited

U.S. PATENT DOCUMENTS

| | | | |
|---|---|---|---|
| 5,930,164 A * | 7/1999 | Zhu ............................. | 365/158 |
| 6,545,906 B1 | 4/2003 | Savtchenko et al. | |
| 6,633,498 B1 | 10/2003 | Engel et al. | |
| 7,095,646 B2 * | 8/2006 | Slaughter et al. ............ | 365/158 |
| 7,158,406 B2 * | 1/2007 | Iwata .......................... | 365/158 |
| 7,218,556 B2 * | 5/2007 | Kim et al. .................... | 365/158 |
| 2004/0012994 A1 * | 1/2004 | Slaughter et al. ............ | 365/158 |
| 2007/0171704 A1 * | 7/2007 | Hung et al. .................. | 365/158 |

* cited by examiner

*Primary Examiner*—J. H. Hur
*Assistant Examiner*—Alexander Sofocleous
(74) *Attorney, Agent, or Firm*—Finnegan, Henderson, Farabow, Garrett & Dunner LLP

(57) ABSTRACT

A method for writing a memory cell of a magnetoresistive random access memory (MRAM) device includes, sequentially, providing a first magnetic field in a first direction, providing a second magnetic field in a second direction substantially perpendicular to the first direction, turning off the first magnetic field, providing a third magnetic field in a third direction opposite to the first direction, turning off the second magnetic field, and turning off the third magnetic field. A method for switching magnetic moments in an MRAM memory cell includes providing a magnetic field in a direction forming a blunt angle with a direction of a bias magnetic field. A method for reading an MRAM device includes partially switching magnetic moments in a reference memory cell to generate a reference current; measuring a read current through a memory cell to be read; and comparing the read current with the reference current.

17 Claims, 14 Drawing Sheets

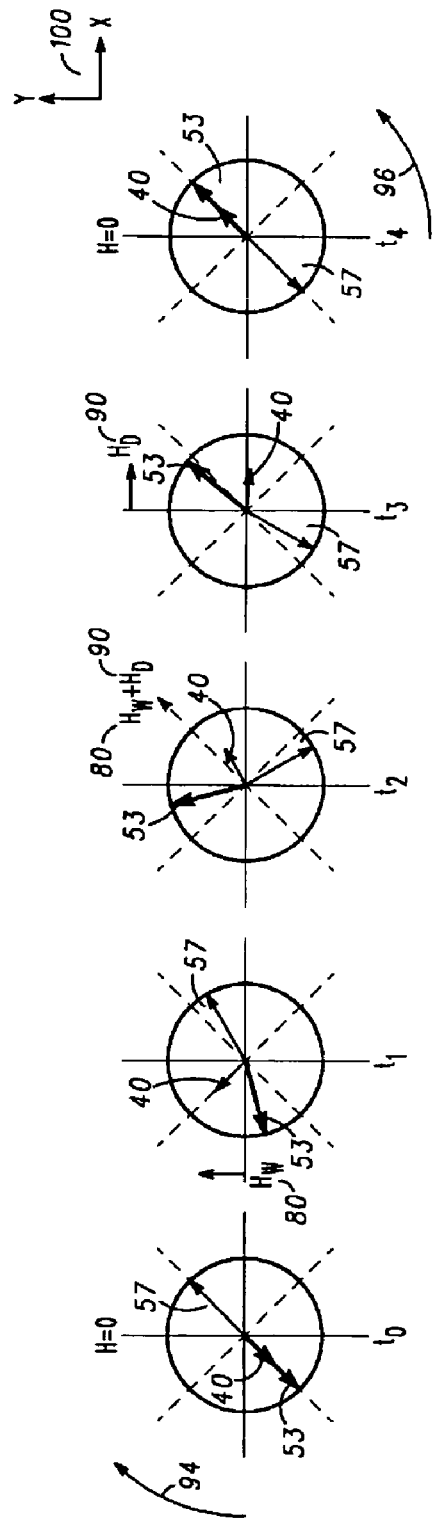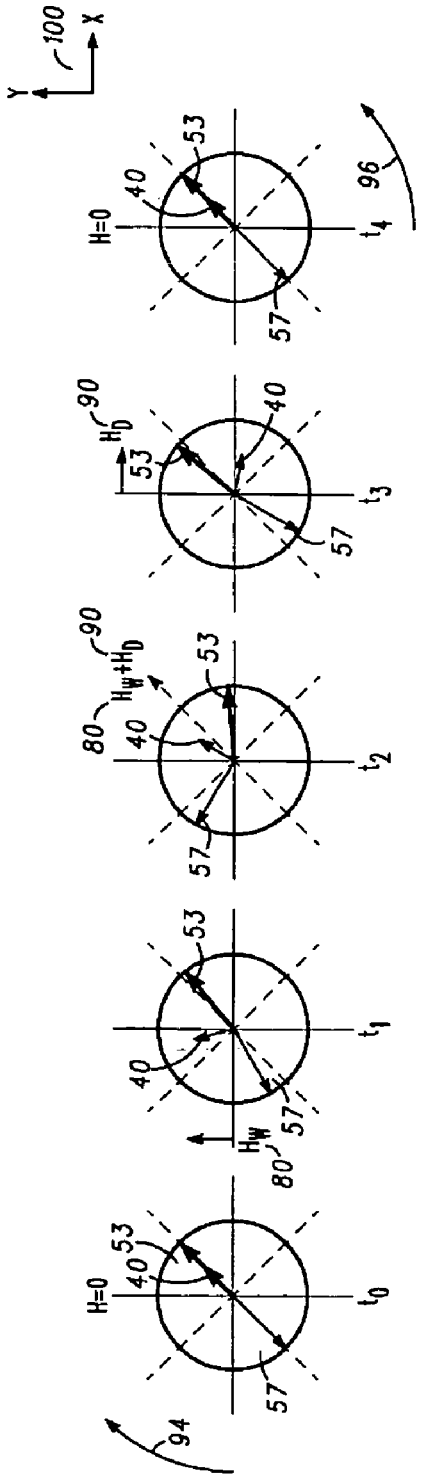

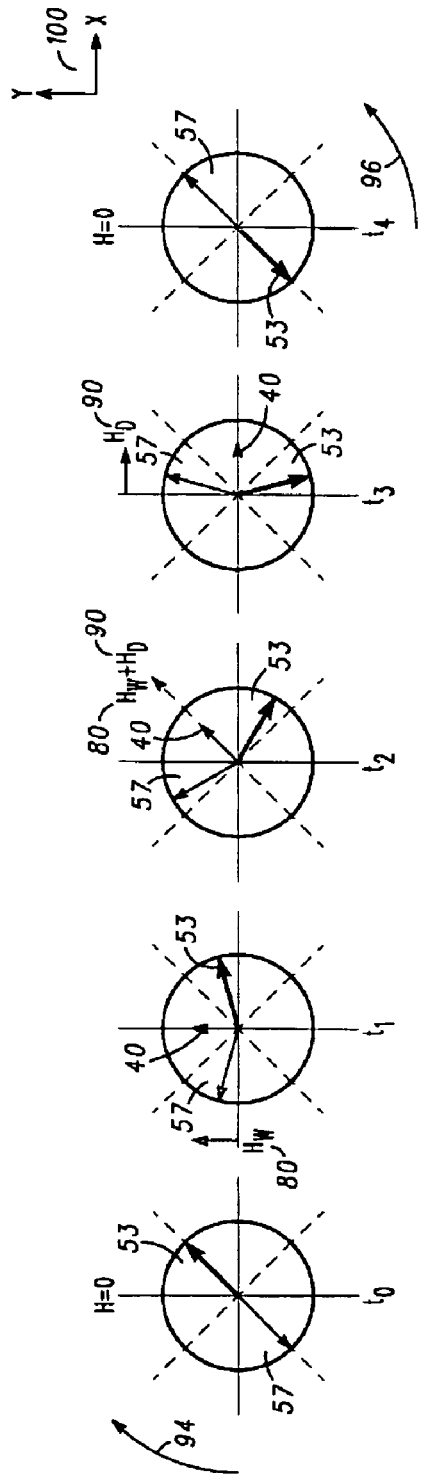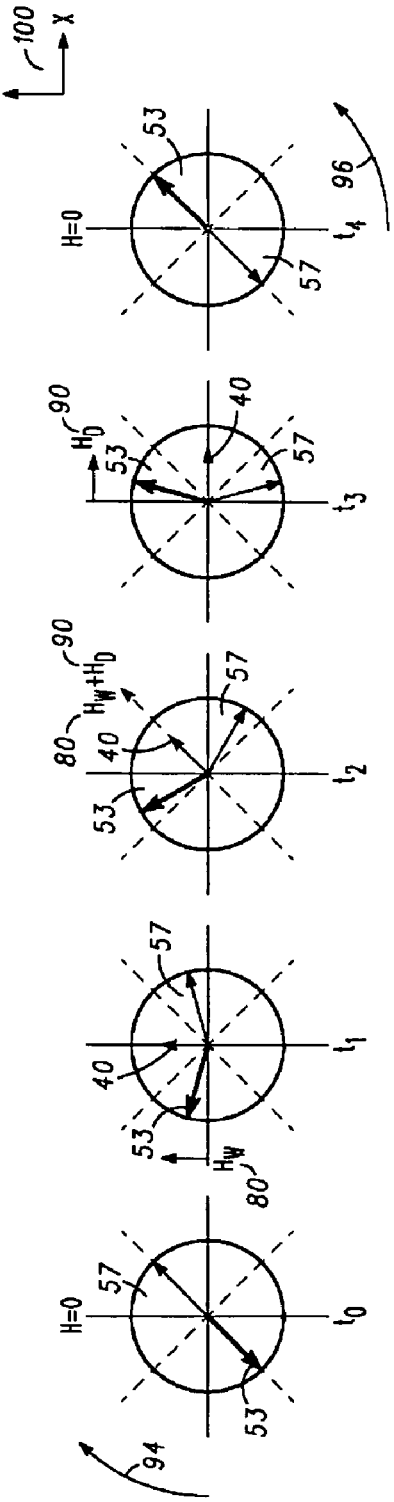

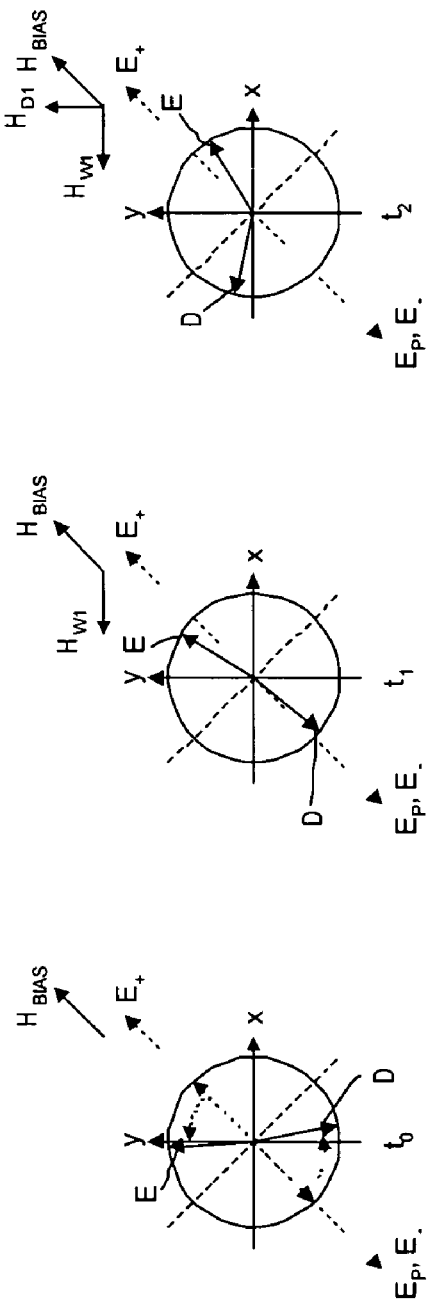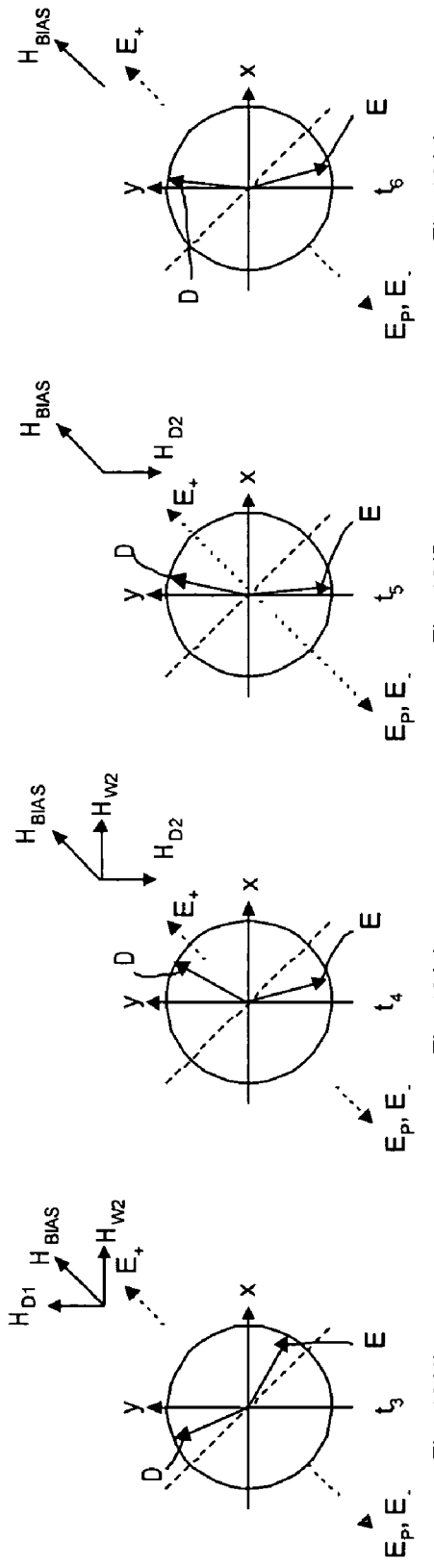

US 7,420,837 B2

METHOD FOR SWITCHING MAGNETIC MOMENT IN MAGNETORESISTIVE RANDOM ACCESS MEMORY WITH LOW CURRENT

BENEFIT OF PRIORITY

The present application is related to, and claims the benefit of priority of, U.S. Provisional Application No. 60/704,885, filed on Aug. 3, 2005, entitled "Method for Writing a Toggle Memory Cell with Low Writing Current", the entire contents of which are incorporated herein by reference.

FIELD OF THE INVENTION

This invention relates in general to a method for writing to magnetoresistive random access memory (MRAM) devices.

BACKGROUND OF THE INVENTION

Magnetoresistive random access memories (MRAMs) have been proposed as an alternative to conventional memory devices such as static random access memories (SRAM), dynamic random access memories (DRAM), and flash memories. MRAMs store data using a magneto resistance effect, which refers to a phenomenon wherein electrical resistance of a material changes with magnetic fields to which the material is subjected. As compared to these conventional memories, MRAMs are advantageous because of their fast speed, high integration density, low power consumption, radiation hardness, and endurance.

U.S. Pat. No. 6,545,906 to Savtchenko et al. discloses a conventional MRAM and the writing methods thereof. FIGS. 1-4, 7-8, 5-6 of U.S. Pat. No. 6,545,906 are reproduced herein as FIGS. 1-8, respectively.

FIG. 1 shows a memory cell 10 of an MRAM array 3. Memory cell 10 is sandwiched between a word line 20 and a digit line 30. Word line 20 and digit line 30 are perpendicular to each other and include conductive materials so that currents can pass therethrough.

Memory cell 10 includes a first magnetic region 15, a tunneling barrier 16, and a second magnetic region 17, wherein tunneling barrier 16 is sandwiched between first magnetic region 15 and second magnetic region 17. First magnetic region 15 has a synthetic anti-ferromagnetic (SAF) structure and includes a tri-layer structure 18, with an anti-ferromagnetic coupling spacer layer 65 sandwiched between two ferromagnetic layers 45 and 55. Anti-ferromagnetic coupling spacer layer 65 has a thickness 86 and ferromagnetic layers 45 and 55 have thicknesses 41 and 51, respectively. Second magnetic region 17 has a tri-layer structure 19, with an anti-ferromagnetic coupling spacer layer 66 sandwiched between two ferromagnetic layers 46 and 56. Anti-ferromagnetic coupling spacer layer 66 has a thickness 87 and ferromagnetic layers 46 and 56 have thicknesses 42 and 52, respectively. The thickness 86 of anti-ferromagnetic coupling spacer layer 65 is such that ferromagnetic layers 45 and 55 are anti-ferromagnetically coupled, i.e., a magnetic moment vector 57 of ferromagnetic layer 45 and a magnetic moment vector 53 of ferromagnetic layer 55 are anti-parallel to each other. Similarly, thickness 87 of anti-ferromagnetic coupling spacer layer 66 is such that ferromagnetic layers 46 and 56 are anti-ferromagnetically coupled, i.e., a magnetic moment vector 58 of ferromagnetic layer 46 and a magnetic moment vector 59 of ferromagnetic layer 56 are anti-parallel to each other. FIG. 1 also shows a resultant moment vector 40 of magnetic region 15, i.e., the combination of moment vector 57 of ferromagnetic layer 45 and moment vector 53 of ferromagnetic layer 55, and a resultant moment vector 50 of magnetic region 17, i.e., the combination of moment vector 58 of ferromagnetic layer 46 and moment vector 59 of ferromagnetic layer 56.

FIG. 2 shows magnetic moments in memory cell 10 with respect to the directions of word line 20 and digit line 30. In FIG. 2, word line 20 is shown to run horizontally along an x-axis and digit line 30 is shown to run vertically along a y-axis. Tri-layer structure 18 has two easy axes: a positive easy axis at an angle of 45° with both the positive x-axis direction and the positive y-axis direction and a negative easy axis is at an angle of 45° with both the negative x-axis direction and the negative y-axis direction. An easy axis is defined as an intrinsic orientation of magnetic dipole moments of an anisotropic material in the absence of an external magnetic or biasing field. Thus, moment vector 57 of ferromagnetic layer 45 is in the positive easy axis direction, and magnetic moment vector 53 of ferromagnetic layer 55 is in the negative easy axis direction. Resultant magnetic moment vector 40 of magnetic region 15 is thus either in the positive easy axis direction or the negative easy axis direction. FIG. 2 shows the resultant magnetic moment vector 40 of magnetic region 15 to be in the negative easy axis direction. Although not shown in FIG. 2, it is assumed that moment vector 58 of ferromagnetic layer 46 is in the negative easy axis direction, moment vector 59 of ferromagnetic layer 56 is in the positive easy axis direction, and resultant magnetic moment vector 50 of magnetic region 17 is in the negative easy axis direction.

Generally, magnetic region 15 is a free ferromagnetic region and magnetic region 17 is a pinned ferromagnetic region, i.e., magnetic moments in magnetic region 15 are free to rotate when an external magnetic field is applied, while magnetic moments in magnetic region 17 do not rotate when a moderate external magnetic field is applied.

An electron tunneling barrier of tunneling barrier 16 and, therefore, electrical resistance of memory cell 10, change with magnetic fields. For example, when moment vector 53 of ferromagnetic layer 55 and moment vector 58 of ferromagnetic layer 46 are parallel to each other, tunneling barrier 16 has a low electron tunneling barrier and memory cell 10 has a low resistance. When moment vector 53 of ferromagnetic layer 55 and moment vector 58 of ferromagnetic layer 46 are anti-parallel to each other, tunneling barrier 16 has a high electron tunneling barrier and memory cell 10 has a high resistance. Thus, by altering the magnetic moment vectors of magnetic region 15, a bit of datum may be stored in memory cell 10, with high and low electrical resistances of thereof respectively defining a bit of "1" or "0", or the converse.

To read memory cell 10, a voltage may be applied across memory cell 10 and a current therethrough is sensed. Memory array 3 may include at least one dummy memory cell having the same structure as memory cell 10. The dummy memory cell may have magnetic moments configured in a certain manner and unaltered during operation of memory array 3. The same voltage applied across memory cell 10 may be applied to the dummy memory cell and a current through the dummy memory cell is sensed and used as a reference current. Then, the current through memory cell 10 is compared with the reference current and the difference indicates whether memory cell 10 has a "0" or "1" stored therein.

Currents provided in word line 20 and digit line 30 induce magnetic fields. For example, with reference to FIGS. 1 and 2, a word current 60 ($I_W$) through word line 20 induces a circular word magnetic field 80 ($H_W$), and a digit current 70 ($I_D$) through digit line 30 induces a circular digit magnetic field 90 ($H_D$). The strength of magnetic fields $H_W$ and $H_D$ are respectively proportional to word current $I_W$ and digit current $I_D$. It is assumed that word line 20 is above memory cell 10 and digit line 30 is below memory cell 10. Thus, when word current $I_W$ is positive, $H_W$ is in the positive y-axis direction in the plane of memory cell 10; when digit current $I_D$ is positive, $H_D$ is in the positive x-axis direction in the plane of memory cell 10.

Under magnetic fields $H_W$ and $H_D$, electron spins in ferromagnetic layers 45 and 55 flop (so-called "spin flop"), and moment vectors 57 and 53 may rotate. Consequently, resultant magnetic moment vector 40 also rotates. When resultant magnetic moment vector 40 rotates by 180°, moment vector 53 of ferromagnetic layer 55 and moment vector 58 of ferromagnetic layer 46 are anti-parallel to each other, and memory cell 10 is said to be switched, either from "0" to "1", or from "1" to "0", depending on how "0" and "1" are defined.

FIG. 3 shows the simulated switching behavior of tri-layer structure 18 under different magnetic fields $H_W$ and $H_D$, where $H_W$ and $H_D$ are generated by a pulse of word current $I_W$ and a pulse of digit current $I_D$ provided in a sequence 100 shown in FIG. 4. Particularly, as shown in FIG. 4, at time $t_0$, both $I_W$ and $I_D$ are 0; at time $t_1$, $I_W$ is supplied; at time $t_2$, $I_D$ is also supplied; at time $t_3$, $I_W$ is turned off; and at time $t_4$, $I_D$ is also turned off. In FIG. 3, the x-axis is the amplitude of word magnetic field $H_W$ in Oersteds, and the y-axis is the amplitude of digit magnetic field $H_D$ in Oersteds.

FIG. 3 shows three operation regions of memory cell 10. First, in a "no-switching" region 92, one or both of $I_W$ and $I_D$ are small and the corresponding one or both of $H_W$ and $H_D$ are weak. Memory cell 10 does not switch state.

A second operation region of memory cell 10 is referred to as a "direct" writing region, where both $I_W$ and $I_D$ are large and $H_W$ and $H_D$ are strong. $I_W$ and $I_D$, when applied in sequence 100, directly write to memory cell 10. For example, if both $I_W$ and $I_D$ are positive, after $I_W$ and $I_D$ are provided in sequence 100, a bit of "1" is written into memory cell 10, regardless of whether the initial state of memory cell is "0" or "1". Similarly, if both $I_W$ and $I_D$ are negative, after $I_W$ and $I_D$ are provided in sequence 100, a bit of "0" is written into memory cell 10. Under direct writing, an imbalance between moment vectors 53 and 57, i.e., resultant moment vector 40, is significant.

FIGS. 5(a)-5(e) and 6(a)-6(e) illustrate the examples of directly writing to memory cell 10.

FIGS. 5(a)-5(e) illustrate an example of directly writing "1" into memory cell 10, which has an initial state of "0", by applying a positive word current $I_W$ and a positive digit current $I_D$. It is assumed that moment vector 53 of ferromagnetic layer 55 is in the negative easy axis direction, moment vector 57 of ferromagnetic layer 45 is in the positive easy axis direction, and moment vector 53 is stronger than moment vector 57. It is also assumed that moment vector 58 of ferromagnetic layer 46 is in the negative easy axis direction, moment vector 59 of ferromagnetic layer 56 is in the positive easy axis direction, and moment vector 58 is stronger than moment vector 59. It is further assumed that memory cell 10 has a bit of "0" stored therein when moment vector 53 of ferromagnetic layer 55 and moment vector 58 of ferromagnetic layer 46 are parallel with each other, and has a bit of "1" stored therein when moment vector 53 of ferromagnetic layer 55 and moment vector 58 of ferromagnetic layer 46 are anti-parallel with each other.

As FIG. 5(a) shows, at time $t_0$, moment vector 57 of ferromagnetic layer 45 is in the positive easy axis direction. Moment vector 53 of ferromagnetic layer 55 is in the negative easy axis direction. Because moment vector 53 is assumed to be stronger than moment vector 57, resultant magnetic moment vector 40 is also in the negative easy axis direction. Memory cell 10 has a bit of "0" stored therein.

Referring to FIG. 5(b), at time $t_1$, positive word current $I_W$ is provided, generating word magnetic field $H_W$ in the positive y-axis direction. Because magnetic moments tend to align with external magnetic fields to lower the energy of a system, both moment vectors 53 and 57 tend to rotate towards the direction of $H_W$, i.e., the positive y-axis direction. However, due to the anti-ferromagnetic coupling between ferromagnetic layers 45 and 55, and also due to the fact that moment vector 53 is stronger than moment vector 57, both moment vectors 53 and 57 rotate in the clockwise direction, with resultant magnetic moment vector 40 rotating towards the direction of the magnetic moment vector of the external magnetic field, i.e., the positive y-axis direction.

Referring to FIG. 5(c), at time $t_2$, positive digit current $I_D$ is provided, generating digit magnetic field $H_D$ in the positive x-axis direction. Assuming $H_W$ and $H_D$ have the same magnitude, a magnetic field vector of the total external magnetic field is in the positive easy axis direction. For the same reasons stated above, both moment vectors 53 and 57 further rotate in the clockwise direction, and resultant magnetic moment vector 40 rotates towards the direction of the magnetic moment vector of the external magnetic field.

Referring to FIG. 5(d), at time $t_3$, word current $I_W$ is turned off. The external magnetic field has only one component, i.e., $H_D$, in the positive x-axis direction. Moment vectors 53 and 57 and resultant magnetic moment vector 40 further rotate in the clockwise direction. Moment vector 53 is now closer to the positive easy axis, and moment vector 57 is closer to the negative easy axis. Resultant magnetic moment vector 40 is close to the positive x-axis.

Finally, as FIG. 5(e) shows, at time $t_4$, digit current $I_D$ is also turned off. The external magnetic field is zero. Moment vectors 53 and 57 align with the easy axes. Because moment vector 53 was closer to the positive easy axis, and moment vector 57 was closer to the negative easy axis prior to time $t_4$, moment vector 53 aligns with the positive easy axis, and moment vector 57 aligns with the negative easy axis. In other words, both moment vectors 53 and 57 have rotated 180° from their initial states in FIG. 5(a). As a result, moment vector 53 is anti-parallel with moment vector 58 of ferromagnetic layer 46, and a bit of "1" is written in memory cell 10.

FIGS. 6(a)-6(e) illustrate an example of directly writing "1" into memory cell 10, which has an initial state of "1". As FIG. 6(a) shows, at time $t_0$, moment vector 53 is in the positive easy axis direction. Moment vector 57 is in the negative easy axis direction. Resultant magnetic moment vector 40 is in the positive easy axis direction. Memory cell 10 has a bit of "1" stored therein.

As shown in FIG. 6(b), at time $t_1$, positive word current $I_W$ is provided, generating word magnetic field $H_W$ in the positive y-axis direction. Because moment vector 53 is stronger, there will only be minimal clockwise rotation of moment vectors 53 and 57. But resultant magnetic moment vector 40 rotates counterclockwise towards $H_W$.

As shown in FIG. 6(c), at time $t_2$, positive digit current $I_D$ is provided, generating digit magnetic field $H_D$ in the positive x-axis direction. Moment vectors 53 and 57 rotate in the clockwise direction, and resultant magnetic moment vector 40 rotates in the direction of the magnetic field vector of the external magnetic field, which is in the positive easy axis direction.

As shown in FIG. 6(d), at time $t_3$, word current $I_W$ is turned off. The external magnetic field has only one component, i.e., $H_D$, in the positive x-axis direction. Resultant moment vector 40 further rotates clockwise towards $H_D$. Because moment vector 53 was closer to the positive easy axis, and moment vector 57 was closer to the negative easy axis prior to time $t_4$, moment vector 53 rotates counterclockwise towards the positive easy axis, and moment vector 57 rotates counterclockwise towards the negative easy axis.

Then, as shown in FIG. 6(e), when digit current $I_D$ is also turned off at time $t_4$, moment vectors 53 and 57 return to their original states and align along the easy axes. As a result, a bit of "1" is written in memory cell 10.

Negative currents $I_W$ and $I_D$ may be provided to write a bit of "0" into memory cell 10. The behavior of memory cell 10 during direct writing of a bit of "0" is similar to those described above with reference to FIGS. 5(a)-5(e) and FIGS. 6(a)-6(e), except that the polarities of the magnetic moments are opposite, and is therefore not described herein.

When $I_W$ and $I_D$ are even larger and $H_W$ and $H_D$ are even stronger, memory cell 10 operates in a third region called "toggle" region 97, as shown in FIG. 3. When large positive currents $I_W$ and $I_D$ are provided in sequence 100, the state of memory cell 10 switches, i.e., an initial state of "0" switches to "1" and an initial state of "1" switches to "0". This writing method is referred to as "toggle writing." Under toggle writing, because strong $H_W$ and $H_D$ are provided, the imbalance between moment vectors 53 and 57, i.e., resultant moment vector 40, is insignificant or weak.

FIGS. 7(a)-7(e) illustrate an example of toggle writing to memory cell 10 with an initial state of "1".

As FIG. 7(a) shows, at time $t_0$, moment vector 53 of ferromagnetic layer 55 is in the positive easy axis direction. Moment vector 57 of ferromagnetic layer 45 is in the negative easy axis direction. Weak resultant magnetic moment vector 40 is in the positive easy axis direction. Memory cell 10 has a bit of "1" stored therein.

As shown in FIG. 7(b), at time $t_1$, positive word current $I_W$ is provided, generating strong word magnetic field $H_W$ in the positive y-axis direction. Because $H_W$ is very strong, both moment vectors 53 and 57 rotate clockwise, and resultant magnetic Moment vector 40 substantially aligns with the direction of $H_W$. Particularly, both moment vectors 53 and 57 now point above the x-axis.

As shown in FIG. 7(c), at time $t_2$, positive digit current $I_D$ is provided, generating strong digit magnetic field $H_D$ in the positive x-axis direction. Moment vectors 53 and 57 further rotate in the clockwise direction, and resultant magnetic moment vector 40 substantially aligns with the direction of the magnetic field vector of the external magnetic field, which is in the positive easy axis direction. Moment vector 53 is now between the positive x-axis and the bisector of the angle between the positive x-axis and the negative y-axis. Moment vector 57 is now between the positive y-axis and the bisector of the angle between the negative x-axis and the positive y-axis.

As shown in FIG. 7(d), at time $t_3$, word current $I_W$ is turned off. The external magnetic field has only one component, i.e., $H_D$, in the positive x-axis direction. Resultant moment vector 40 substantially aligns with $H_D$. Moment vectors 53 and 57 further rotate in the clockwise direction. Moment vector 53 is now closer to the negative easy axis. Moment vector 57 is now closer to the positive easy axis.

Then, as FIG. 7(e) shows, digit current $I_D$ is also turned off at time $t_4$. Because, prior to time $t_4$, moment vector 53 was closer to the negative easy axis, and moment vector 57 was closer to the positive easy axis, moment vector 53 aligns with the negative easy axis, and moment vector 57 aligns with the positive easy axis. As a result, a bit of "0" is written in memory cell 10.

When memory cell 10 has an initial state of "0", toggle writing with large positive currents $I_W$ and $I_D$ writes a bit of "1" into memory cell 10. FIGS. 8(a)-8(e) show the changes with time of moment vectors 40, 53, and 57, when $I_W$ and $I_D$ are provided in sequence 100 as shown in FIG. 4. The behavior of memory cell 10 during toggle writing of a bit of "1" is similar to those described above with reference to FIGS. 7(a)-7(e), except that the polarities of the magnetic moments are opposite, and is therefore not described herein.

Because during toggle writing, the state of memory cell 10 always changes, the initial state of memory cell 10 must be read and compared to the state to be written prior to performing toggle writing. If the initial state is the same as the datum to be written, no toggle writing is necessary. If the initial state is different from the datum to be written, toggle writing is performed. Thus, as compared to direct writing, toggle writing requires additional logic circuitry. However, because toggle writing only writes a memory cell when the state of the memory cell needs to be changed, toggle writing consumes less power.

Because toggle writing requires strong external magnetic fields $H_W$ and $H_D$, large writing currents are needed. To alleviate this problem, Engel et al. proposed in U.S. Pat. No. 6,633,498 to adjust the magnitude of magnetic moment vector 50 of magnetic region 17 to generate a fringe (or stray) magnetic field as a bias magnetic field $H_{BIAS}$ in tri-layer structure 18, such that only weak magnetic fields $H_W$ and $H_D$ are required to toggle write memory cell 10. FIGS. 4 and 5 of U.S. Pat. No. 6,663,498 are reproduced herein respectively as FIGS. 9 and 10. As FIGS. 9 and 10 show, if positive $H_W$ and $H_D$ are used to write memory cell 10, a bias magnetic field $H_{BIAS}$ in a direction between the positive x-axis direction and the positive y-axis direction lowers the required values of $H_W$ and $H_D$. Similarly, if negative $H_W$ and $H_D$ are used to write memory cell 10, a bias magnetic field $H_{BIAS}$ in a direction between the negative x-axis direction and the negative y-axis direction lowers the required values of $H_W$ and $H_D$. Consequently, lower currents $I_W$ and $I_D$ are required. The stronger the bias magnetic field $H_{BIAS}$ is, the lower the currents $I_W$ and $I_D$ may be.

However, a strong $H_{BIAS}$ may cause writing failure. Particularly, when $H_{BIAS}$ is strong, magnetization in end domains of ferromagnetic layers 45 and 55 is irregular, and memory cell 10 may fail to switch in response to writing currents $I_W$ and $I_D$. FIGS. 11(a)-11(e) illustrate an example when the toggle writing method fails to write a bit of "1" into memory cell 10 having an initial state of "0" when $H_{BIAS}$ is strong.

FIG. 11(a) shows the state of memory cell 10 at time $t_0$. A strong $H_{BIAS}$ is generated in the positive easy axis direction. Because of the strong $H_{BIAS}$, magnetization in end domains of ferromagnetic layers 45 and 55 is so irregular that the magnetic moment vectors thereof, 57 and 53, may rotate counterclockwise and respectively approach or pass the y-axis, as shown in FIG. 11(a). Then, as FIG. 11(b) shows, at time $t_1$, positive word current $I_W$ is provided, generating word magnetic field $H_W$ in the positive y-axis direction. Because moment vector 53 is close to the positive x-axis and moment vector 57 is close to negative x-axis, and a combination of $H_W$ and $H_{BIAS}$ is in a direction between the positive y-axis and positive x-axis, moment vectors 53 and 57 further rotate counterclockwise. As FIG. 11(c) shows, at time $t_2$, positive digit current $I_D$ is provided, generating digit magnetic field $H_D$ in the positive x-axis direction. In response, moment vectors 53 and 57 start to rotate in the clockwise direction. As FIG. 11(d) shows, at time $t_3$, when word current $I_W$ is turned off, moment vectors 53 and 57 further rotate in the clockwise direction. Now moment vector 53 is closer to the negative easy axis and moment vector 57 is closer to the positive easy axis. As FIG. 11(e) shows, at time $t_4$, when digit current $I_D$ is also turned off, moment vectors 53 and 57 return to their original positions as in FIG. 11(a). Thus, moment vectors 53 and 57 rotate in the wrong direction under $H_W$ because of the strong bias field $H_{BIAS}$, and memory cell 10 fails to switch after $I_W$ and $I_D$ are provided in sequence 100 of FIG. 4.

When Memory cell 10 is scaled down, and magnetic regions 15 and 17 are very small, the above-described problem worsens, because irregularities of the magnetic field in ferromagnetic regions 15 and 17 increase. As a result, it is difficult to reduce writing currents $I_W$ and $I_D$ to a satisfactory level.

SUMMARY OF THE INVENTION

Consistent with embodiments of the present invention, a method for writing a memory cell of a magnetoresistive random access memory (MRAM) device includes providing a first magnetic field in a first direction, providing a second magnetic field in a second direction, the second direction being substantially perpendicular to the first direction, turning off the first magnetic field, providing a third magnetic field in a third direction, the third direction being opposite to the first direction, turning off the second magnetic field, and turning off the third magnetic field.

Consistent with embodiments of the present invention, a method for writing a memory cell of a magnetoresistive random access memory (MRAM) device includes providing a first magnetic field in a first direction, providing a second magnetic field in a second direction, the second direction being substantially perpendicular to the first direction, turning off the first magnetic field, providing a third magnetic field in a third direction, the third direction being opposite to the first direction, turning off the second magnetic field, providing a fourth magnetic field in a fourth direction, the fourth direction being opposite to the second direction, turning off the third magnetic field, and turning off the fourth magnetic field.

Consistent with embodiments of the present invention, there is provided a method for writing a magnetoresistive random access memory (MRAM) device. The MRAM device includes a plurality of memory cells each corresponding to one of a plurality of word lines and one of a plurality of digit lines. The method for writing the MRAM device includes writing one of the memory cells by providing a first magnetic field in a first direction, providing a second magnetic field in a second direction, the second direction being substantially perpendicular to the first direction, turning off the first magnetic field, providing a third magnetic field in a third direction, the third direction being opposite to the first direction, turning off the second magnetic field, and turning off the third magnetic field.

Consistent with embodiments of the present invention, there is also provided a method for writing a magnetoresistive random access memory (MRAM) device. The MRAM device includes a plurality of memory cells each corresponding to one of a plurality of word lines and one of a plurality of digit lines. The method for writing the MRAM device includes writing one of the memory cells by providing a first magnetic field in a first direction, providing a second magnetic field in a second direction, the second direction being substantially perpendicular to the first direction, turning off the first magnetic field, providing a third magnetic field in a third direction, the third direction being opposite to the first direction, turning off the second magnetic field, providing a fourth magnetic field in a fourth direction, the fourth direction being opposite to the second direction, turning off the third magnetic field, and turning off the fourth magnetic field.

Consistent with embodiments of the present invention, a method for switching magnetic moments in a memory cell of a magnetoresistive random access memory (MRAM) device includes providing a first magnetic field in a first direction, wherein the first direction forms a blunt angle with a direction of a bias magnetic field to which the memory cell is subjected.

Consistent with embodiments of the present invention, a method for reading a magnetoresistive random access memory (MRAM) device includes partially switching magnetic moments in a reference memory cell to generate a reference current; measuring a read current through a memory cell to be read; and comparing the read current with the reference current to determine a state of the memory cell to be read.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain features, advantages, and principles of the invention.

In the drawings,

FIGS. 5(a)-5(e) illustrate an example of directly writing to the memory cell of FIG. 1;

FIGS. 6(a)-6(e) illustrate another example of directly writing to the memory cell of FIG. 1;

FIGS. 7(a)-7(e) illustrate an example of toggle writing to the memory cell of FIG. 1;

FIGS. 8(a)-8(e) illustrate another example of toggle writing to the memory cell of FIG. 1;

FIGS. 18(a)-18(g) illustrate an example of toggle writing the memory cell of FIG. 12 consistent with the third embodiment of the present invention;

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Consistent with embodiments of the present invention, there are provided methods for switching magnetic moments in memory cells of a magnetoresistive random access memory (MRAM) device with low currents. There are also provided methods for writing or read MRAM devices with low writing or reading currents using the methods for switching magnetic moments consistent with embodiments of the present invention.

Figure 12:
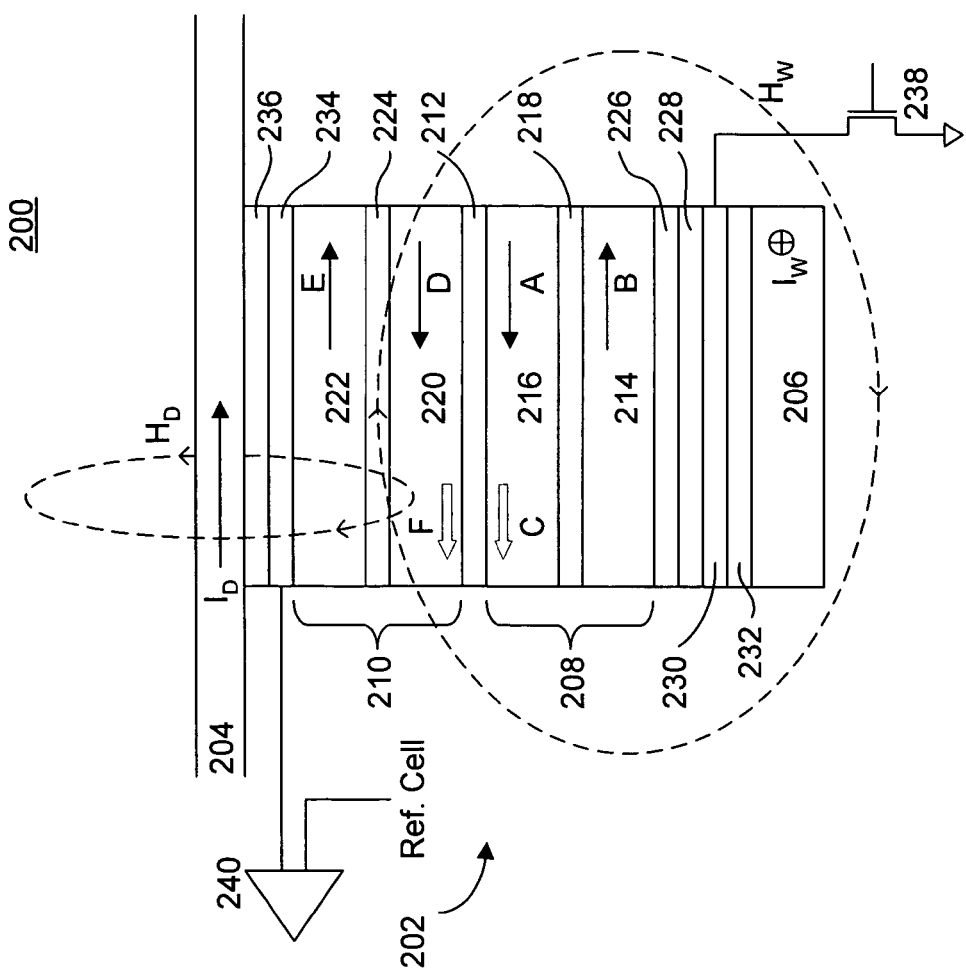
FIG. 12 shows a memory cell of an MRAM to be accessed by methods consistent with embodiments of the present invention.

FIG. 12 shows an exemplary MRAM device 200 including an array of memory cells. Only one of the memory cells, memory cell 202, is shown. MRAM device 200 includes a plurality of write bit lines 204 and a plurality of write word lines 206. Write bit lines 204 and write word lines 206 are substantially perpendicular to each other. Each memory cell corresponds to one write bit line 204 and one write word line 206.

Memory cell 202 includes a pinned magnetic region 208, a free magnetic region 210, and a tunneling barrier 212 sandwiched between pinned magnetic region 208 and free magnetic region 210.

Pinned magnetic region 208 may comprise a pinned ferromagnet or a synthetic anti-ferromagnetic (SAF) structure. FIG. 12 shows that pinned magnetic region 208 comprises a three-layered SAF structure including two ferromagnetic layers 214 and 216 sandwiching an anti-ferromagnetic coupling spacer layer 218. Ferromagnetic layers 214 and 216 may comprise, for example, cobalt-iron (CoFe), nickel-iron (NiFe), or cobalt-iron-boron (CoFeB). Anti-ferromagnetic coupling spacer layer 218 may comprise, for example, ruthenium (Ru) or copper (Cu). A thickness of anti-ferromagnetic coupling spacer layer 218 is such that ferromagnetic layers 214 and 216 are anti-ferromagnetically coupled to each other.

Free magnetic region 210 may comprise an SAF including two ferromagnetic layers 220 and 222 sandwiching an anti-ferromagnetic coupling spacer layer 224. Ferromagnetic layers 220 and 222 may comprise, for example, cobalt-iron (CoFe), cobalt-iron-boron (CoFeB), or nickel-iron (NiFe). Anti-ferromagnetic coupling spacer layer 224 may comprise, for example, ruthenium (Ru) or copper (Cu). A thickness of anti-ferromagnetic coupling spacer layer 224 is such that ferromagnetic layers 220 and 222 are anti-ferromagnetically coupled to each other. Although FIG. 12 only shows free magnetic region 210 to include three layers, it is to be understood that a multi-layered SAF structure having more than three layers can also be used. For example, free magnetic region 210 may comprise three or more ferromagnetic layers separated by coupling spacer layers.

Tunneling barrier 212 may comprise, for example, aluminum oxide ($AlO_x$) or magnesium oxide (MgO).

Additionally, an anti-ferromagnetic pinning layer 226, a buffer layer 228, a bottom electrode 230, and a dielectric layer 232 are provided between pinned magnetic region 208 and write word line 206. Anti-ferromagnetic pinning layer 226 may comprise, for example, platinum manganese (PtMn) or manganese iridium (MnIr). Buffer layer 228 may comprise, for example, nickel-iron (NiFe), nickel-iron-chromium (NiFeCr) or nickel-iron-cobalt (NiFeCo). An upper electrode 234 is provided on free magnetic region 210 and a dielectric layer 236 is provided between upper electrode 234 and write bit line 204.

Anti-ferromagnetic pinning layer 226 pins a magnetic moment of pinned magnetic region 208, such that the magnetic moment of pinned magnetic region 208 does not rotate when a moderate magnetic field is applied. In contrast, a magnetic moment of free magnetic region 210 is free to rotate under an external magnetic field.

An electron tunneling barrier of tunneling barrier 212 and, therefore, a resistance of memory cell 202, change with magnetic fields. For example, when the respective magnetic moment vectors of ferromagnetic layers 216 and 220 are parallel to each other, tunneling barrier 212 has a low electron tunneling barrier and memory cell 202 has a low resistance. When the respective magnetic moment vectors of ferromagnetic layers 216 and 220 are anti-parallel to each other, tunneling barrier 212 has a high electron tunneling barrier and memory cell 202 has a high resistance. Thus, memory cell 202 may store one bit of "1" or "0" defined by the value of the resistance thereof. For example, a high resistance of memory cell 202 may represent a bit of "1" and a low resistance of memory cell 202 may represent a bit of "0", or the converse.

MRAM device 200 also includes a plurality of transistors each coupled to one of the memory cells. Particularly, FIG. 12 shows one transistor 238 coupled to bottom electrode 230 of memory cell 202. MRAM device 200 also includes a plurality of sense amplifiers coupled to the memory cells. Particularly, FIG. 12 shows one sense amplifier 240 coupled to upper electrode 234 of memory cell 202 to sense a current flowing through memory cell 202 and also coupled to sense a reference current through a reference cell (not shown) in order to determine a state of memory cell 202. Address lines (not shown), i.e., word lines or bit lines, are coupled to gates of the transistors and sense amplifiers for selecting one of the memory cells. Thus, to read the datum stored in memory cell 202, the corresponding word line and bit line are activated to select memory cell 202, transistor 238 is thus turned on, a voltage is applied between upper electrode 234 and bottom electrode 230, and a current through memory cell 202 is sensed by sense amplifier 240. Although FIG. 12 shows sense amplifier 240 directly coupled to upper electrode 234, it is to be understood that sense amplifier 240 may also be coupled to upper electrode 234 through write bit line 204, with a conductive plug provided in dielectric layer 236 connecting write bit line 204 to upper electrode 234.

Figure 13:
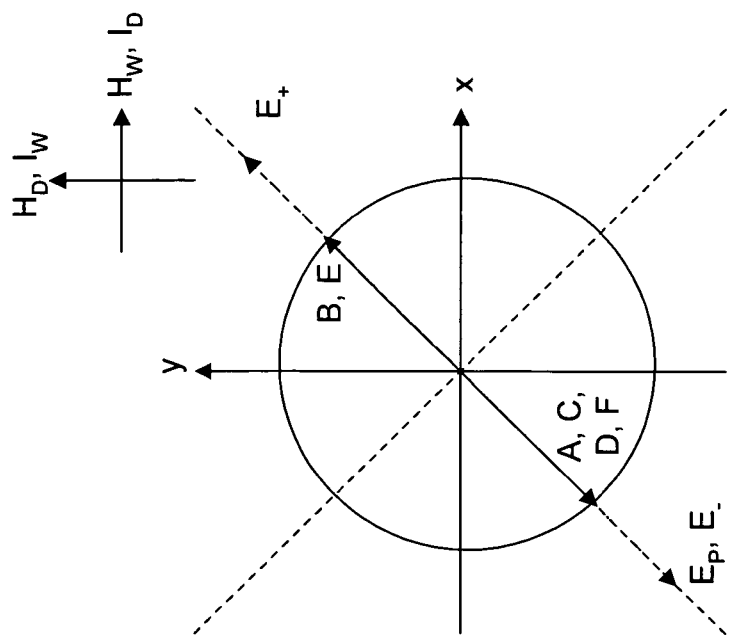
FIG. 13 illustrates magnetic moments in the memory cell of FIG. 12.

FIG. 13 is a plan view illustrating magnetic moments in memory cell 202 with respect to the directions of write bit line 204 and write word line 206 when memory cell 202 is viewed from the top. In FIG. 13, an x-axis is along the direction of write bit line 204 and a y-axis is along the direction of write word line 206. More particularly, the positive x-axis in FIG. 13 is in the direction along write bit line 204 shown in FIG. 12 from left to right, and the positive y-axis in FIG. 13 is in the direction along write word line 206 shown in FIG. 12 from outside the paper into the plane of the paper. Easy axes of pinned magnetic region 208 and free magnetic region 210 can be set during manufacturing of MRAM device 200. It is assumed that pinned magnetic region 208 has an easy axis $E_p$ at an angle 45° with both the negative x-axis and the negative y-axis, and free magnetic region 210 has a positive easy axis $E_+$ at an angle of about 45° with both the positive x-axis direction and the positive y-axis direction, and a negative easy axis $E_-$ at an angle of about 45° with both the negative x-axis direction and the negative y-axis direction. In the absence of external magnetic fields, magnetic moment vectors of ferromagnetic layers 214, 216, 220, and 222 align with one of the easy axes. Particularly, in FIG. 13, a magnetic moment vector A of ferromagnetic layer 216 is aligned with easy axis $E_p$, and a magnetic moment vector B of ferromagnetic layer 214 is anti-parallel with moment vector A. It is assumed that moment vector A has a greater magnitude than moment vector B. Therefore, a resultant magnetic moment vector C of pinned magnetic region 208 is in the $E_p$ direction. Also, in FIG. 13, a magnetic moment vector D of ferromagnetic layer 220 is aligned with easy axis $E_-$, and a magnetic moment vector E of ferromagnetic layer 222 is aligned with easy axis $E_+$. It is assumed that moment vector D has a greater magnitude than magnetic moment vector E. Thus, a resultant magnetic moment vector F of free magnetic region 210 is in the E direction. Moment vectors A-F are also labeled on corresponding parts in FIG. 12. It is to be understood that the arrowed lines representing moment vectors A-F in FIGS. 12 and 13 and in following figures only show the directions of the moment vectors, and do not indicate the relative strengths thereof.

Currents provided to write bit line 204 and write word line 206 induce external magnetic fields, and the relationship therebetween is shown in FIGS. 12 and 13. A digit current $I_D$ through write bit line 204 induces a circular digit magnetic field $H_D$, and a word current $I_{W_W}$ through write word line 206 induces a circular word magnetic field $H_{W_W}$. The strength of magnetic fields $H_W$ and $H_D$ are respectively proportional to word current $I_W$ and digit current $I_D$. It is assumed that write bit line 204 is above memory cell 202 and write word line 206 is below memory cell 202. Thus, as shown in FIG. 13, when word current $I_W$ is positive, i.e., in the positive y-axis direction, $H_W$ is substantially in the positive x-axis direction in the plane of memory cell 202; when digit current $I_D$ is positive, i.e., in the positive x-axis direction, $H_D$ is substantially in the positive y-axis direction in the plane of memory cell 202. For convenience of illustration, in the following descriptions and the accompanying drawings, induced external magnetic fields are said or shown to be in the positive or negative x-axis or y-axis direction. It is to be understood that such induced external magnetic fields may or may not be in the positive or negative x-axis or y-axis direction.

Figure 1:
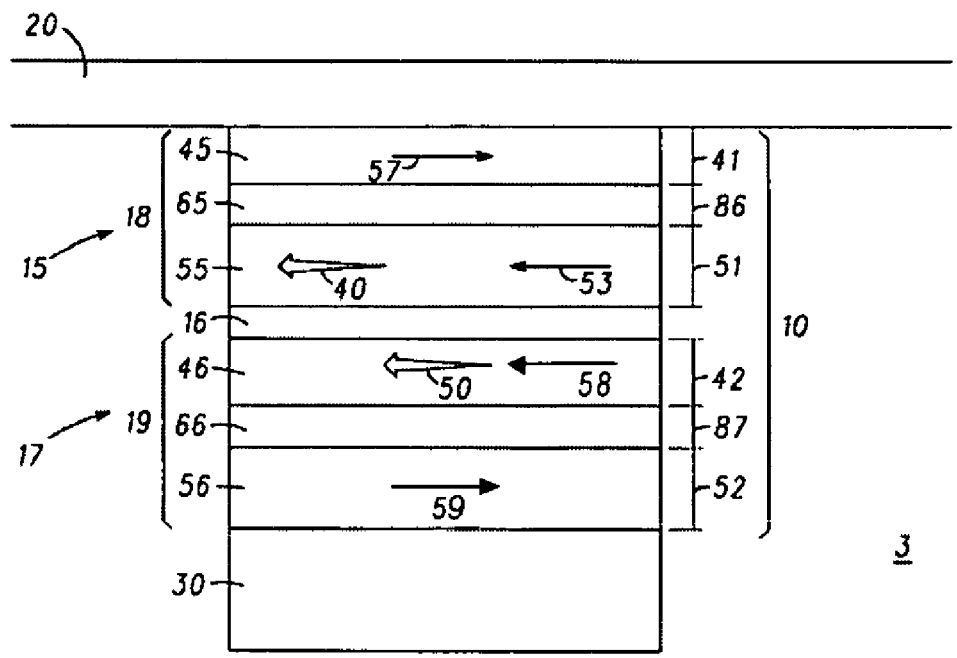
FIG. 1 shows a memory cell of a conventional magnetoresistive random access memory (MRAM) device.
Figure 2:
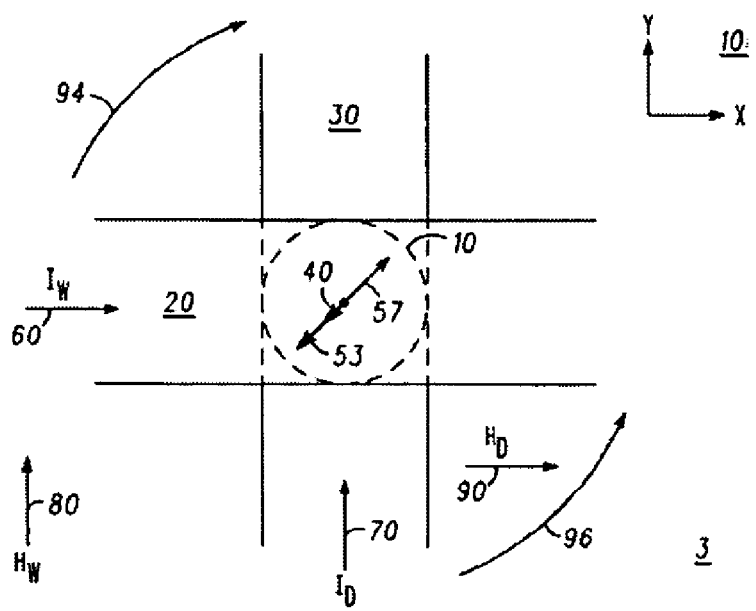
FIG. 2 illustrates magnetic moments in the memory cell of FIG. 1.
Figure 3:
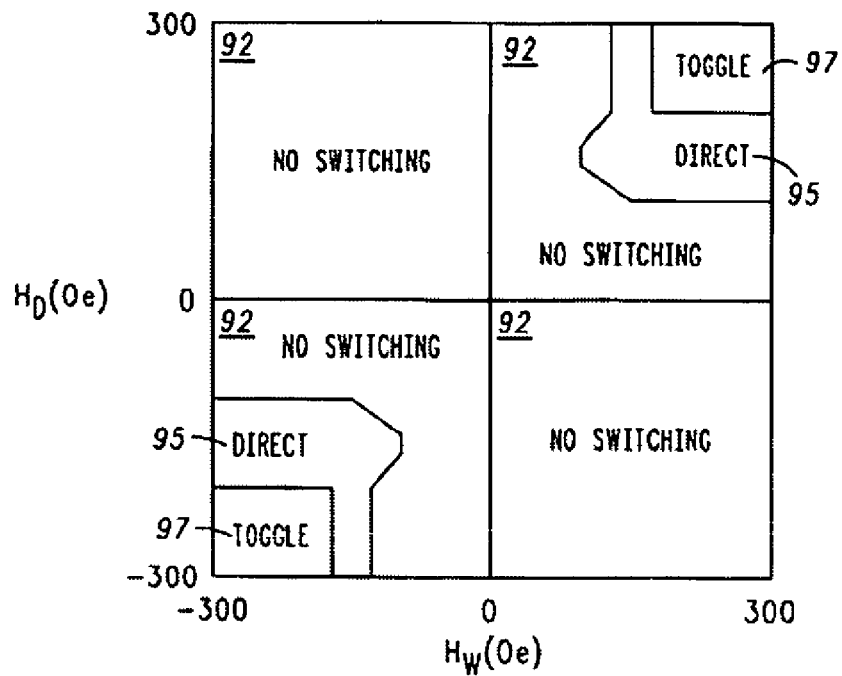
FIG. 3 shows simulated switching behavior of the memory cell of FIG. 1.
Figure 4:
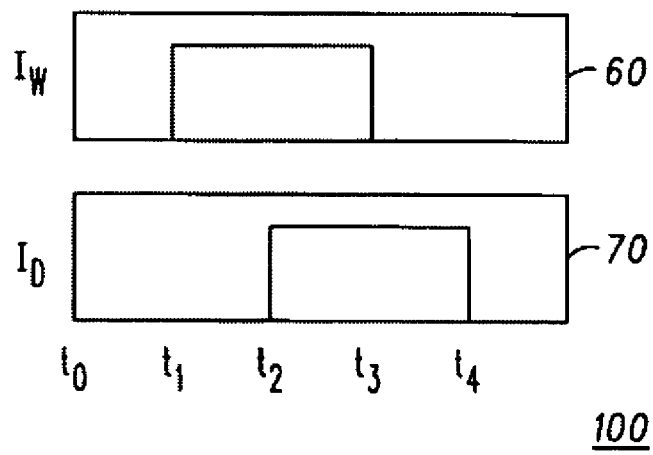
FIG. 4 shows a sequence of pulses of writing currents for writing to the memory cell of FIG. 1.
Figure 9:
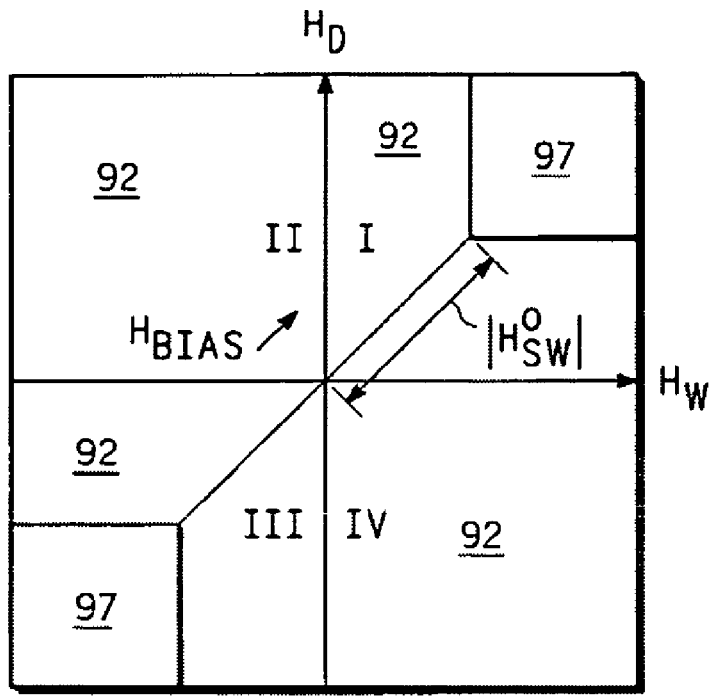
FIGS. 9 and 10 illustrate the effect of a bias magnetic field on toggle writing the memory cell of FIG. 1.
Figure 10:
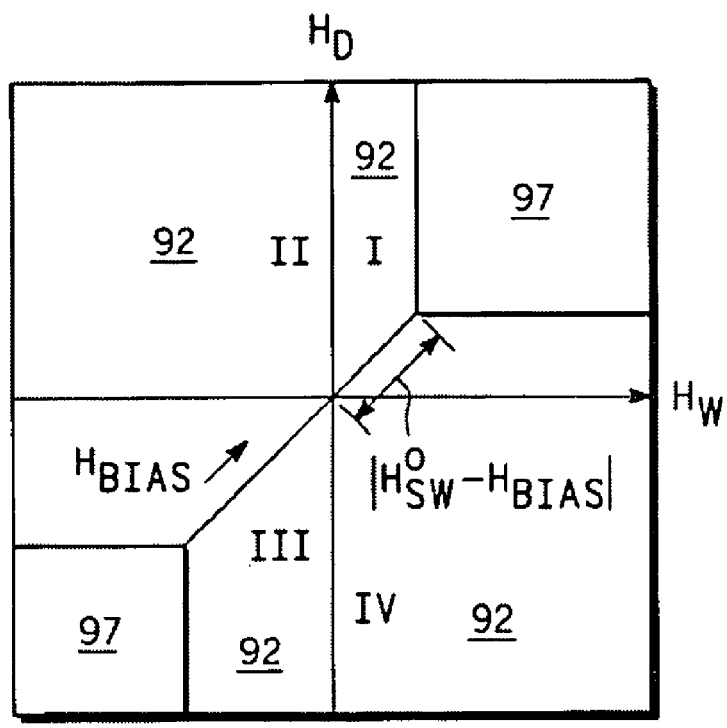
Figures 11A, 11B, 11C, 11D, 11E:
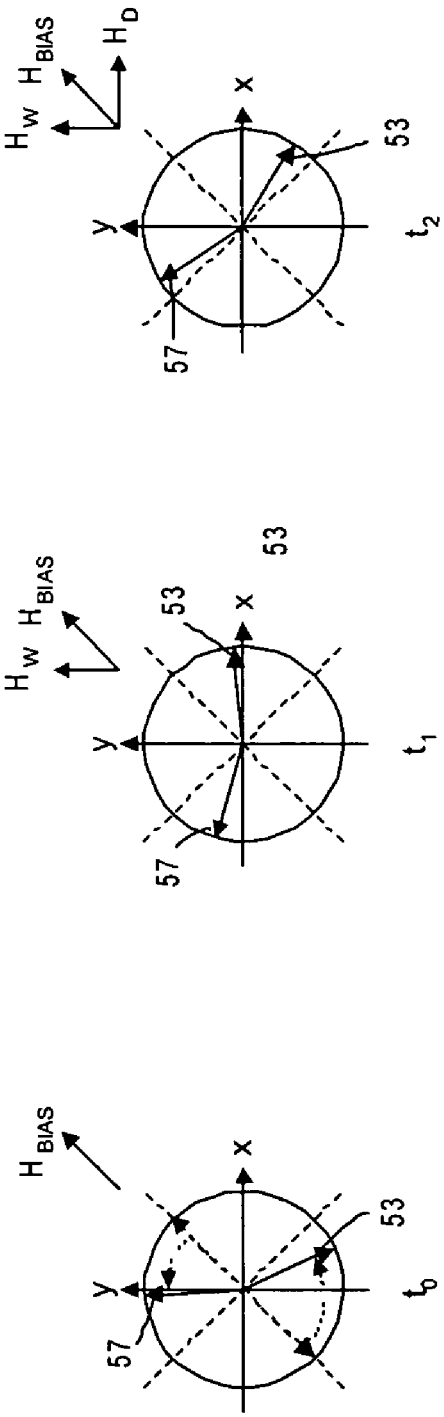
FIGS. 11(a)-11(e) illustrate a problem of a conventional method for toggle writing the memory cell of FIG. 1.

By providing a pulse of word current $I_W$ and a pulse of digit current $I_D$ in sequence 100 as shown in FIG. 4, moment vectors D and E of ferromagnetic layers 220 and 222 may rotate and memory cell 202 may be toggle written, as described above with reference to FIGS. 7(a)-7(e) and 8(a)-8(e). In addition, as proposed by Engel et al., a bias magnetic field $H_{BIAS}$ may be generated by adjusting moment vector C of pinned magnetic region 208, thereby allowing for lower writing currents $I_W$ and ID. However, as noted above, toggle writing may fail under a strong bias magnetic field, and only a relatively weak bias magnetic field can be used and large writing currents are still required. Particularly, if a bias magnetic field $H_{BIAS}$ in a direction between the positive x-axis direction and the positive y-axis direction, moment vectors D and E of ferromagnetic layers 220 and 222 may rotate in the wrong direction when a positive word current $I_W$ is applied.

A method for switching magnetic moments of a MRAM memory cell consistent with a first embodiment of the present invention obviates the above-noted problem due to a strong $H_{BIAS}$ by temporarily inducing an external magnetic field that partially offsets $H_{BIAS}$, i.e., a direction of the external magnetic field and a direction of $H_{BIAS}$ form a blunt angle. FIGS. 14(a)-14(d) are referred to for an explanation of the method for switching magnetic moments consistent with the first embodiment of the present invention.

Figure 14A:
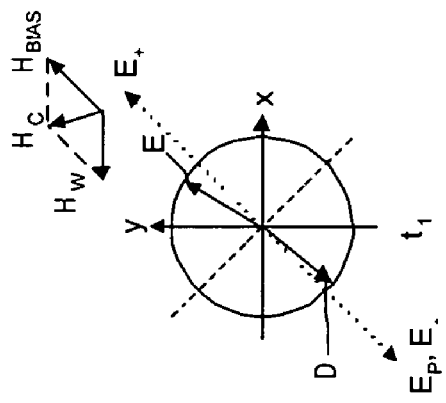
FIGS. 14(a)-14(d) illustrate an example of switching magnetic moments in the memory cell of FIG. 12 consistent with a first embodiment of the present invention.

FIG. 14(a) shows moment vectors D and E when a strong bias magnetic field $H_{BIAS}$ is present. It is assumed that $H_{BIAS}$ is substantially in the $E_+$ direction. As a result, moment vectors D and E may rotate counterclockwise and respectively approach or pass the y-axis.

Figure 14B:
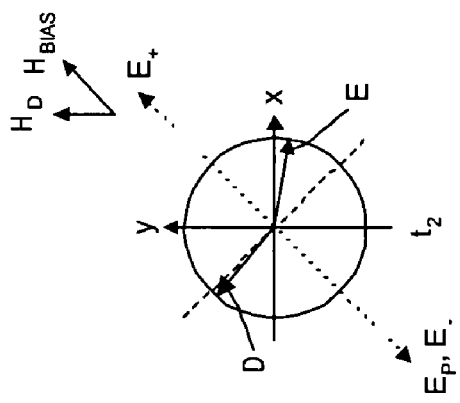

As shown in FIG. 14(b) and consistent with the first embodiment of the present invention, a negative word current is provided in write word line 206, inducing a word magnetic field $H_W$ in the negative x-axis direction. $H_W$ partially offsets $H_{BIAS}$, with the combined magnetic moment $H_C$ in a direction between $H_W$ and $H_{BIAS}$. In one aspect, $H_W$ may completely offset a component of $H_{BIAS}$ in the positive x-axis direction such that $H_C$ is in the positive y-axis direction. As a result of $H_W$, moment vectors D and E both rotate clockwise and approach easy axes $E_+$ and $E_-$.

Figure 14C:
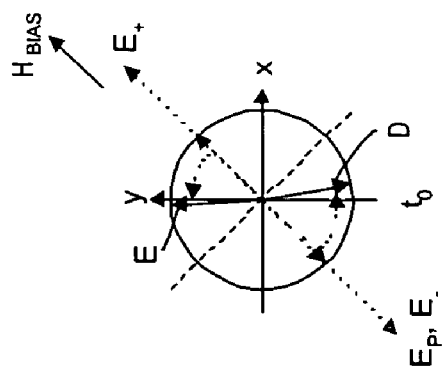
Figure 14D:
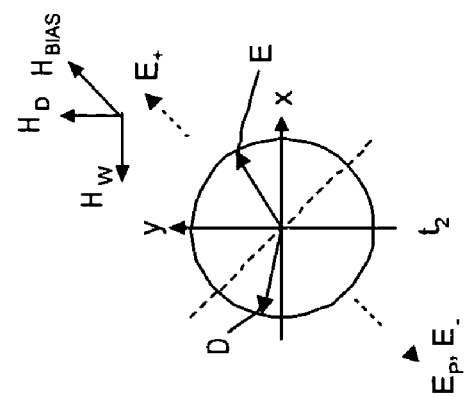

Conventional steps for rotating moment vectors D and E may then follow. For example, if moment vectors need to be rotated clockwise, a positive digit current may be provided to induce a digit magnetic field $H_D$ in the positive y-axis direction, i.e., at an angle of about 45° with $H_{BIAS}$, as shown in FIG. 14(c).

After the conventional steps begin, the negative word current may be discontinued. For example, in FIG. 14(d), after the negative word current is discontinued, moment vectors D and E further rotate clockwise, which is the desired result of applying the positive word current.

Thus, by temporarily offsetting bias magnetic field $H_{BIAS}$, the above-described problem associated with strong $H_{BIAS}$ is obviated.

In FIG. 14(b), it is assumed that $H_W$ is in the negative x-axis direction and therefore at an angle of about 135° with $H_{BIAS}$. However, it is to be understood that the direction of $H_W$ may be at any blunt angle with $H_{BIAS}$ by, e.g., providing a combination of currents in both write bit line 204 and write word line 206.

The method for switching magnetic moments consistent with the first embodiment of the present invention may be applied to access a memory cell of an MRAM device in the presence of a strong bias magnetic field $H_{BIAS}$ when magnetic moment vectors of the memory cell need to be rotated. For example and consistent with a second embodiment of the present invention, the method consistent with the first embodiment of the present invention may be applied to toggle write an MRAM device, thereby allowing a strong bias magnetic field to further lower the writing currents and to reduce power consumption.

Figure 15:
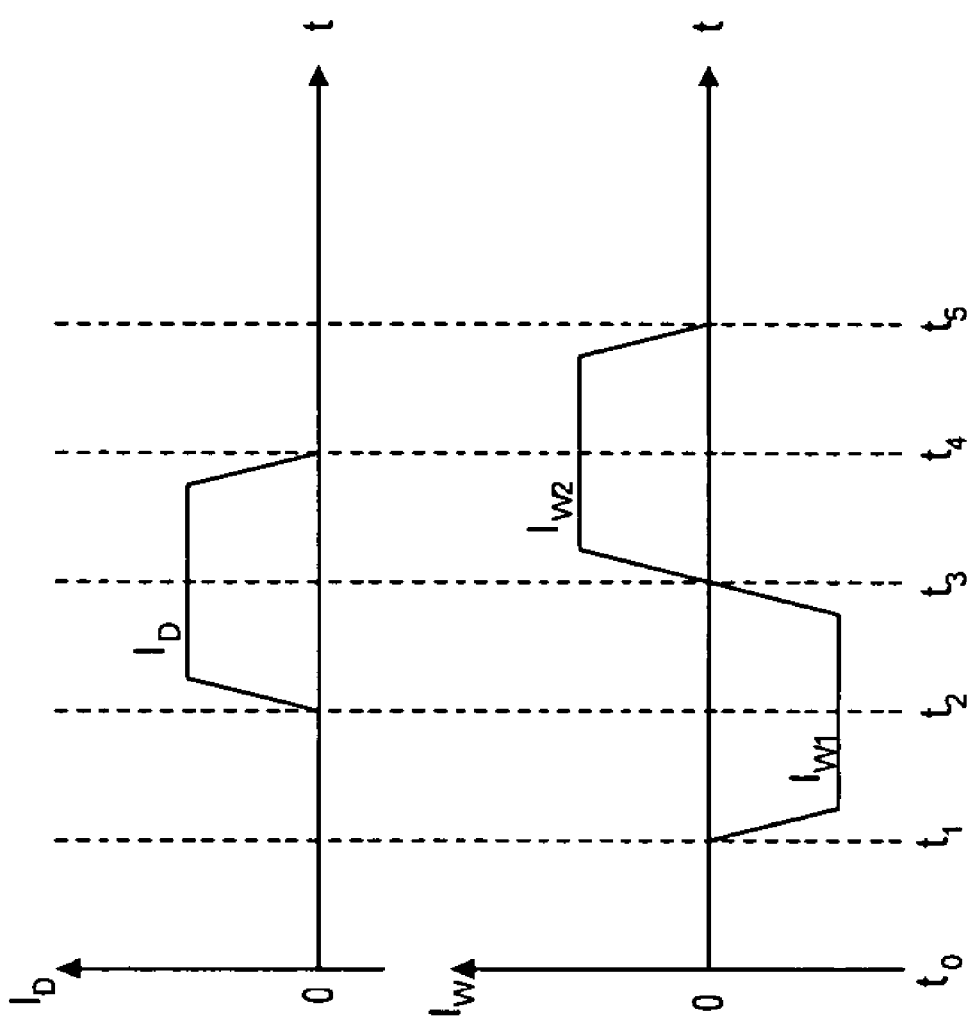
FIG. 15 shows a sequence of current pulses for writing the memory cell of FIG. 12 consistent with a second embodiment of the present invention.

Consistent with the second embodiment of the present invention, three sequential current pulses are provided to write memory cells of an MRAM, while the memory cells are under a strong bias magnetic field. For example, assuming memory cell 202 of MRAM device 200 is under a strong bias magnetic field $H_{BIAS}$ in the positive easy axis $E_+$ direction, three current pulses, including two pulses of digit current and one pulse of word current, may be supplied to toggle write memory cell 202. FIG. 15 shows the timing relationship of the three current pulses. Particularly, at time $t_0$, no writing currents are provided. At time $t_1$, a negative word current $I_{W1}$ is provided. At time $t_2$, a positive digit current $I_D$ is provided. At time $t_3$, $I_{W1}$ is turned off and a positive word current $I_{W2}$ is provided. At time $t_4$, $I_D$ is turned off. At time $t_5$, $I_{W2}$ is turned off. In one aspect, $I_{W1}$ and $I_{W2}$ have the substantially same magnitude. In another aspect, $I_{W1}$ has a suitable magnitude independent of $I_{W2}$.

FIGS. 16(a)-16(e) illustrate an example of toggle writing memory cell 202 using the method consistent with the second embodiment of the present invention. FIGS. 16(a)-16(e) show the positions of only moment vectors D and E of ferromagnetic layers 220 and 222, respectively. It is to be understood that the arrowed lines representing magnetic fields in FIGS. 16(a)-16(e) only show the directions of the magnetic fields, and do not indicate the relative strengths thereof.

Figure 16C:
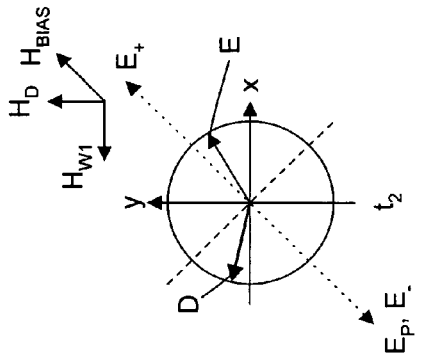
FIGS. 16(a)-16(f) illustrate an example of toggle writing the memory cell of FIG. 12 consistent with the second embodiment of the present invention.
Figure 16F:
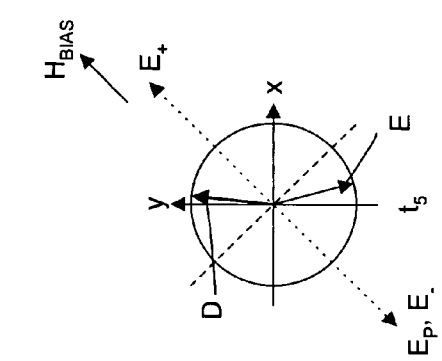
Figure 16B:
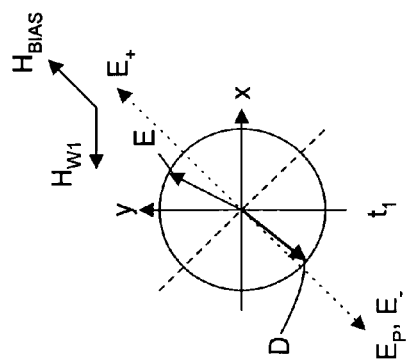
Figure 16E:
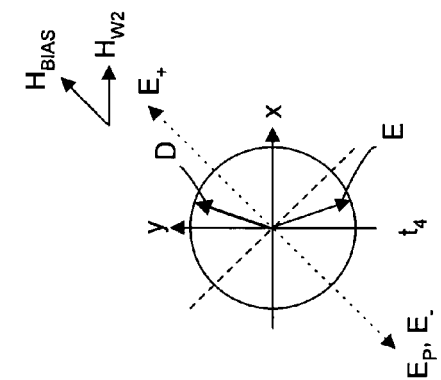
Figure 16A:
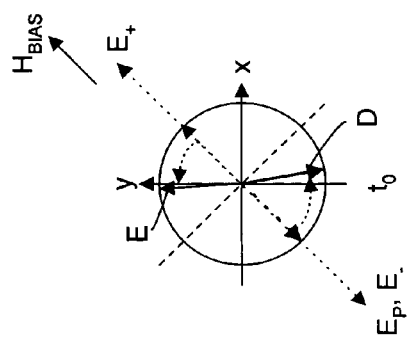

FIG. 16(a) shows the state of memory cell 202 at time $t_0$. Because of the strong $H_{BIAS}$, magnetization in end domains of ferromagnetic layers 220 and 222 may be irregular such that the magnetic moment vectors thereof, D and E, may rotate counterclockwise and respectively approach or pass the y-axis.

As FIG. 16(b) shows, at time $t_1$, negative word current $I_{W1}$ is provided, generating a word magnetic field $H_{W1}$ in the negative x-axis direction, i.e., at an angle of 135° with $H_{BIAS}$. In other words, $H_{W1}$ partially offsets $H_{BIAS}$. As a result, moment vectors D and E rotate clockwise and respectively approach easy axes $E_-$ and $E_+$.

As FIG. 16(c) shows, at time $t_2$, positive digit current $I_D$ is provided, generating a digit magnetic field $H_D$ in the positive y-axis direction. Moment vectors D and E further rotate in the clockwise direction.

Figure 16D:
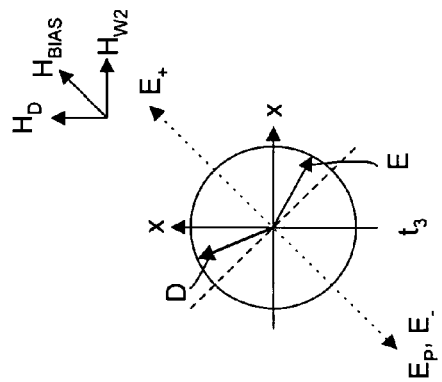

As FIG. 16(d) shows, at time $t_3$, negative word current $I_{W1}$ is turned off, and positive word current $I_{W2}$ is provided, generating a word magnetic field $H_{W2}$ in the positive x-axis direction. Moment vectors D and E further rotate clockwise.

As FIG. 16(e) shows, at time $t_4$, digit current $I_D$ is turned off, and moment vectors D and E further rotate clockwise. Now moment vector D is closer to the positive easy axis $E_+$ direction, and moment vector E is closer to the negative easy axis $E_-$ direction.

As FIG. 16(f) shows, at time $t_5$, positive word current $I_{W2}$ is also turned off. Moment vectors D and E settle in positions close to the easy axes. Because moment vector D is closer to the positive easy axis $E_+$ direction and moment vector E is closer to the negative easy axis E direction prior to time $t_5$, moment vector D settles in a position close to the positive easy axis $E_+$ direction and moment vector E settles in a position close to the negative easy axis $E_-$ direction. In other words, moment vectors D and E have switched positions as compared to time $t_0$ as shown in FIG. 16(a), and the state of memory cell 202 has successfully switched.

Other memory cells of MRAM device 200 may be written using the same method described above.

Consistent with the second embodiment of the present invention, by first applying a negative word magnetic field $H_{W1}$ to partially offset $H_{BIAS}$, thereby causing moment vectors D and E to rotate clockwise, moment vectors D and E continue to rotate clockwise under $I_{W1}$, $I_D$, and $I_{W2}$. Thus, the problem of magnetic moment vectors rotating in the wrong direction caused by strong bias field $H_{BIAS}$ is obviated even when small writing currents $I_{W1}$, $I_D$, and $I_{W2}$ are applied.

Figure 17:
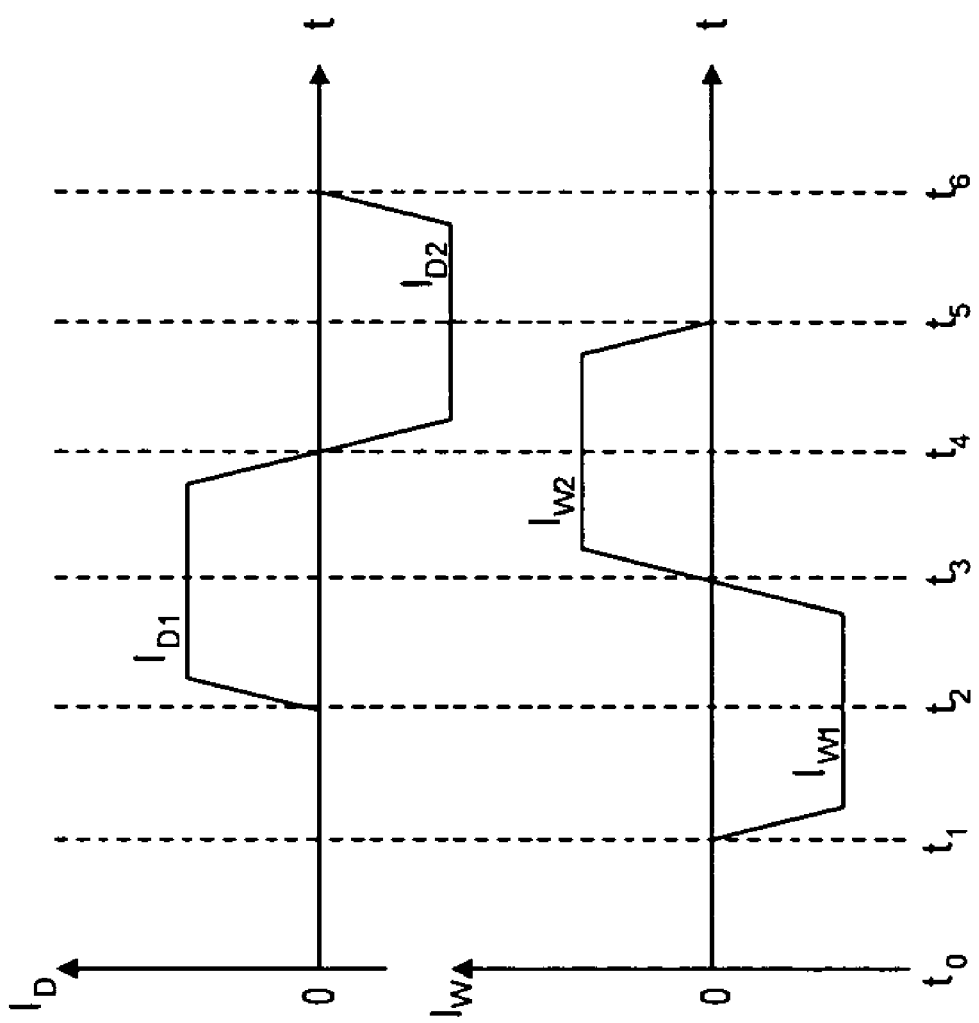
FIG. 17 shows a sequence of current pulses for writing the memory cell of FIG. 12 consistent with a third embodiment of the present invention.

Consistent with a third embodiment of the present invention, four sequential current pulses are provided to write a memory cell of an MRAM, where the memory cell is under a strong bias magnetic field. For example, if memory cell 202 of MRAM device 200 is under a strong bias magnetic field $H_{BIAS}$ in the positive easy axis $E_+$ direction, four current pulses, including two pulses of digit current and two pulses of word current, may be supplied to write memory cell 202. FIG. 17 shows the timing relationship of the four current pulses. Particularly, at time $t_0$, no writing currents are provided. At time $t_1$, a negative word current $I_{W1}$ is provided. At time $t_2$, a positive digit current $I_{D1}$ is provided. At time $t_3$, $I_{W1}$ is turned off and a positive word current $I_{W2}$ is provided. At time $t_4$, $I_{D1}$ is turned off and a negative digit current $I_{D2}$ is provided. At time $t_5$, $I_{W2}$ is turned off. At time $t_6$, $I_{D2}$ is turned off. In one aspect, $I_{D1}$ and $I_{D2}$ have the substantially same magnitude. In another aspect, $I_{D1}$ has a suitable magnitude independent of $I_{D2}$. In one aspect, $I_{W1}$ and $I_{W2}$ have the substantially same magnitude. In another aspect, $I_{W1}$ has a suitable magnitude independent of $I_{W2}$.

FIGS. 18(a)-18(g) illustrate an example of toggle writing memory cell 202 using the method consistent with the third embodiment of the present invention. FIGS. 18(a)-18(g) show the positions of only moment vectors D and E of ferromagnetic layers 220 and 222, respectively. It is to be understood that the arrowed lines representing magnetic fields in FIGS. 18(a)-18(g) only show the directions of the magnetic fields, and do not indicate the relative strengths thereof.

FIG. 18(a) shows the state of memory cell 202 at time $t_0$. Because of the strong $H_{BIAS}$, magnetization in end domains of ferromagnetic layers 220 and 222 may be irregular such that the magnetic moment vectors thereof, D and E, may rotate counterclockwise and respectively approach or pass the y-axis.

As FIG. 18(b) shows, at time $t_1$, negative word current $I_{W1}$ is provided, generating a word magnetic field $H_{W1}$ in the negative x-axis direction. As a result, moment vectors D and E rotate clockwise.

As FIG. 18(c) shows, at time $t_2$, positive digit current $I_{D1}$ is provided, generating a digit magnetic field $H_{D1}$ in the positive y-axis direction. Moment vectors D and E further rotate in the clockwise direction.

As FIG. 18(d) shows, at time $t_3$, negative word current $I_{W1}$ is turned off, and positive word current $I_{W2}$ is provided, generating a word magnetic field $H_{W2}$ in the positive x-axis direction. Moment vectors D and E further rotate clockwise.

As FIG. 18(e) shows, at time $t_4$, positive digit current $I_{D1}$ is turned off and negative digit current $I_{D2}$ is provided, generating a digit magnetic field $H_{D2}$ in the negative y-axis direction. As a result, moment vectors D and E further rotate clockwise. Now moment vector D is closer to the positive easy axis $E_+$ direction, and moment vector E is closer to the negative easy axis $E_-$ direction.

As FIG. 18(f) shows, at time $t_5$, positive word current $I_{W2}$ is turned off. Because the magnetic field in the positive x-axis direction is weaker, moment vectors D and E respectively rotate towards the y-axis. Moment vector D is still closer to the positive easy axis $E_+$ direction, and moment vector E has moved closer to the negative easy axis $E_-$ direction.

As FIG. 18(g) shows, at time $t_6$, negative digit current $I_{D2}$ is also turned off. Moment vectors D and E slightly rotate counterclockwise, but because moment vector D is closer to the positive easy axis $E_+$ direction and moment vector E is closer to the negative easy axis E direction prior to time $t_6$, moment vector D settles in a position close to the positive easy axis $E_+$ direction and moment vector E settles in a position close to the negative easy axis $E_-$ direction. In other words, moment vectors D and E have switched positions as compared to time $t_0$ as shown in FIG. 18(a), and the state of memory cell 202 has successfully switched.

Other memory cells of MRAM device 200 may be written using the same method described above.

In comparison with the second embodiment of the present invention, the third embodiment of the present invention further provides a negative digit current $I_{D2}$ to further rotate moment vectors D and E clockwise. As a result, moment vectors D and E move closer to the respective easy axes, thereby further reducing a possibility of writing failure. Therefore, consistent with the third embodiment of the present invention, writing currents $I_{W1}$, $I_{D1}$, $I_{W2}$, and $I_{D2}$ may be even lower than writing currents $I_{W1}$, $I_D$, and $I_{W2}$ as required by the second embodiment of the present invention.

Consistent with embodiments of the present invention, there are also provided methods for switching magnetic moments for reading memory cells in an MRAM device. In particular, a reference current is first obtained by partially switching magnetic moments of a selected reference memory cell and sensing a current through the reference memory cell. For example, referring to FIGS. 12 and 13, if moment vectors D and E are partially switched such that moment vector D is at an angle of approximately 90° with easy axes $E_+$ and $E_-$, and therefore also at an angle of approximately 90° with moment vector A, a resistance of memory cell 202 has an intermediate value, i.e., a value greater than a resistance of memory cell 202 when moment vector D is parallel with moment vector A but lower than a resistance of memory cell 202 when moment vector D is anti-parallel with moment vector A. Thus, when a voltage is applied across memory cell 202, a current therethrough also has an intermediate value and can be used as a reference current. By comparing a reading current through a memory cell with the reference current, a state of that memory cell may be determined.

An example of reading MRAM memory cells consistent with a fourth embodiment of the present invention is described below with reference to FIGS. 19 and 20(a)-20(f), which illustrate the generation of the reference current with memory cell 202 selected as the reference memory cell.

Figure 19:
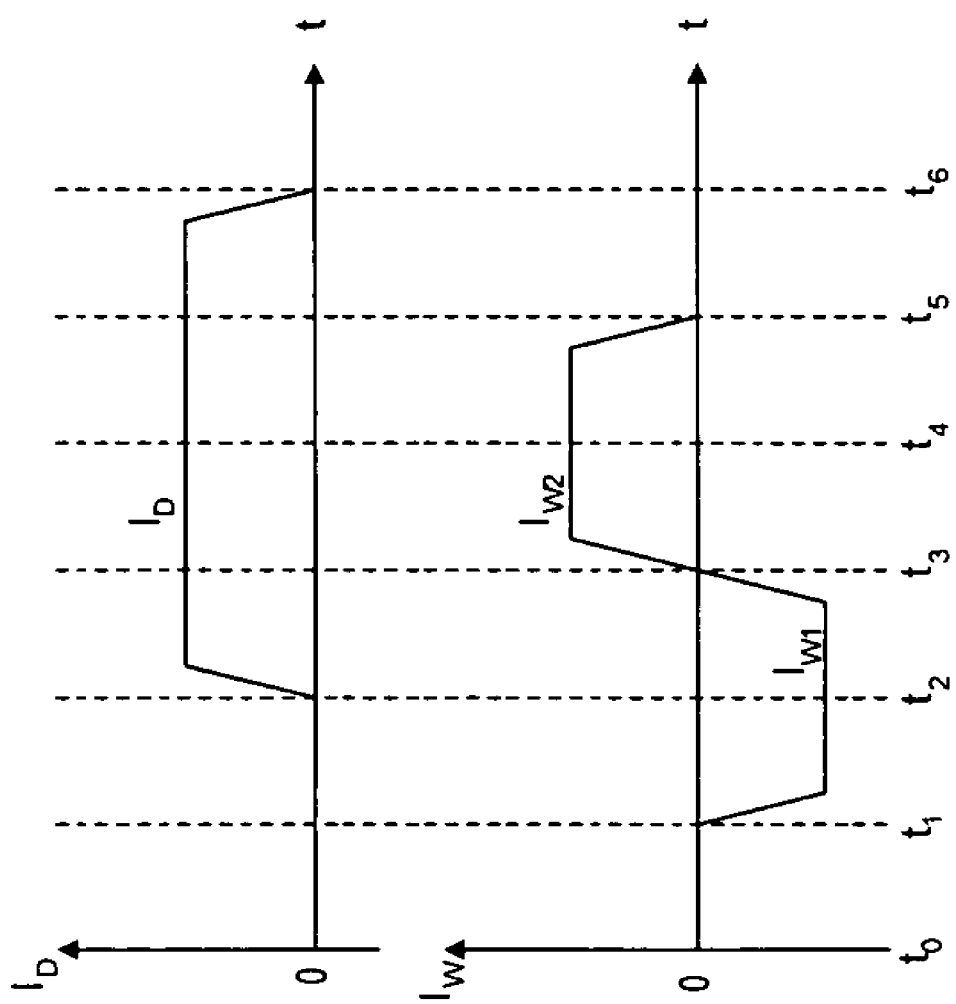
FIG. 19 shows a sequence of current pulses for generating a reference current to be used for reading memory cells in an MRAM device consistent with a fourth embodiment of the present invention.

FIG. 19 shows the timing relationship of three current pulses applied to memory cell 202 for generating the reference current consistent with the fourth embodiment of the present invention. Particularly, at time $t_0$, no currents are provided. At time $t_1$, a negative word current $I_{W1}$ is provided. At time $t_2$, a positive digit current $I_D$ is provided. At time $t_3$, $I_{W1}$ is turned off and a positive word current $I_{W2}$ is provided. Time $t_4$ in FIG. 19 indicates a point of time when the reference current is sensed, as discussed below. At time $t_5$, $I_{W2}$ is turned off. At time $t_6$, $I_D$ is turned off. $I_{W1}$ and $I_{W2}$ may or may not have substantially the same magnitude.

Figure 20C:
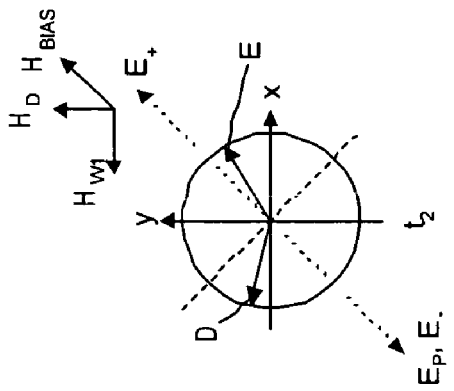
FIGS. 20(a)-20(f) illustrate an example of generating a reference current using the memory cell of FIG. 12 consistent with the fourth embodiment of the present invention.
Figure 20B:
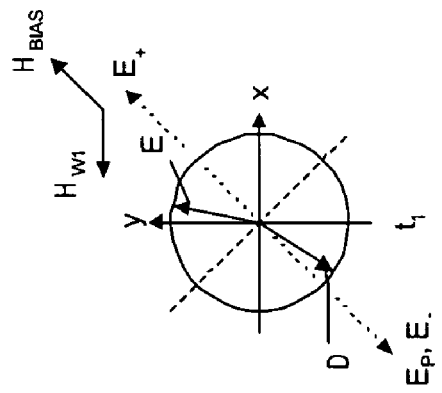
Figure 20A:
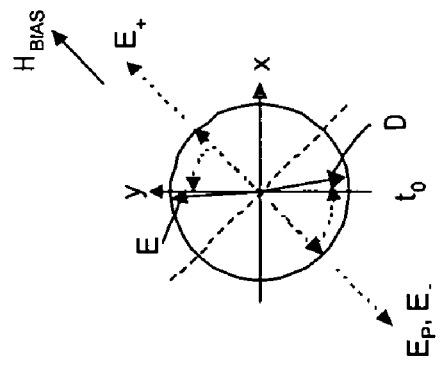

FIGS. 20(a)-20(e) illustrate the positions of moment vectors D and E of ferromagnetic layers 220 and 222, respectively, when the three current pulses in FIG. 19 are applied. FIG. 20(a) shows the state of memory cell 202 at time $t_0$. It is assumed that a bias magnetic field $H_{BIAS}$ is generated by adjusting moment vector C of pinned magnetic region 208. As a result of $H_{BIAS}$, moment vectors D and E may rotate counterclockwise and respectively approach or pass the y-axis.

As FIG. 20(b) shows, at time $t_1$, negative word current $I_{W1}$ is provided, generating a word magnetic field $H_{W1}$ in the negative x-axis direction. As a result, moment vectors D and E rotate clockwise and respectively approach easy axes $E_-$ and $E_+$.

As FIG. 20(c) shows, at time $t_2$, positive digit current $I_D$ is provided, generating a digit magnetic field $H_D$ in the positive y-axis direction. Moment vectors D and E further rotate in the clockwise direction.

Figure 20F:
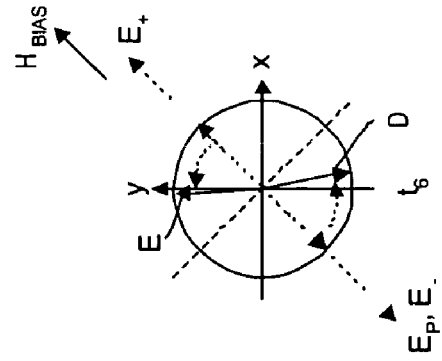
Figure 20E:
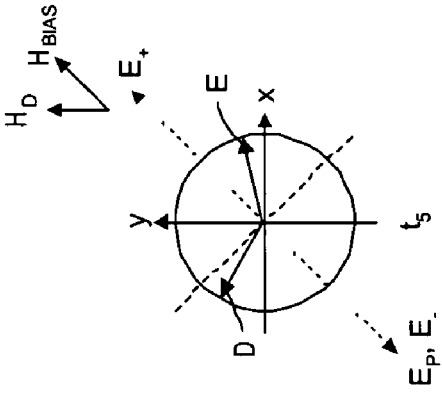
Figure 20D:
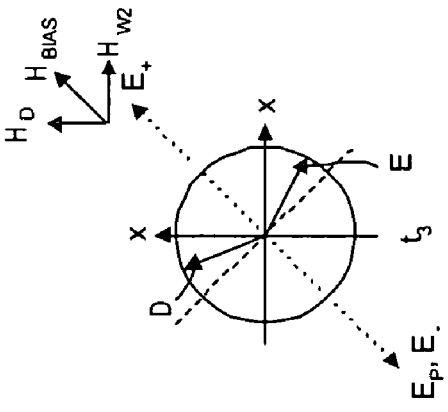

As FIG. 20(d) shows, at time $t_3$, negative word current $I_{W1}$ is turned off, and positive word current $I_{W2}$ is provided, generating a word magnetic field $H_{W2}$ in the positive x-axis direction. Moment vectors D and E further rotate clockwise and are both at an angle of approximately 90° with easy axes $E_+$ and $E_-$.

Then, at time $t_4$ and not shown in the figures, a current through memory cell 202 is sensed as the reference current.

As FIG. 20(e) shows, at time $t_5$, positive word current $I_{W2}$ is turned off. As a result, moment vectors D and E rotate counterclockwise. Now moment vector D is closer to the negative easy axis $E_-$ direction, and moment vector E is closer to the positive easy axis $E_+$ direction.

As FIG. 20(f) shows, at time $t_6$, digit current $I_D$ is also turned off. Moment vectors D and E settle in positions close to the easy axes. Because moment vector D is closer to the negative easy axis $E_-$ direction and moment vector E is closer to the positive easy axis $E_+$ direction prior to time $t_6$, moment vectors D and E return to their respective positions at time $t_0$ as shown in FIG. 20(a).

The reference current obtained at time $t_4$ may then be used for comparison with a current through a memory cell to be read. If the current through the memory cell to be read is smaller than the reference current, it may be determined that the memory cell to be read has a bit of "1" stored therein, assuming a high resistance of memory cell 202 represents a bit of "1". If the current through the memory cell to be read is larger than the reference current, it may be determined that the memory cell to be read has a bit of "0" stored therein. Memory cell 202 may also be read by sensing a current therethrough after time $t_6$ and comparing the sensed current with the reference current.

In the above description of the example of the method consistent with the fourth embodiment of the present invention, it was assumed that a bias magnetic field $H_{BIAS}$ was present. It is to be understood that the method consistent with the fourth embodiment is not limited thereto. For example, if $H_{BIAS}$ is absent, negative word current $I_{W1}$ may be unnecessary and only positive digit current $I_D$ and positive word current $I_{W2}$ are needed. It is also to be understood that moment vectors D and E do not have to be at an angle of approximately 90° with easy axes $E_+$ and $E_-$ for measuring the reference current. Rather, moment vectors D and E may be at any arbitrary angle with easy axes for measuring the reference current, provided that the reference current is sufficiently different from a reading current through a memory cell when the memory cell has a bit of "0" or "1" stored therein. Further, it is to be understood that currents may be provided to write bit line 204 and write word line 206 in any manner, in addition to that shown in FIGS. 19 and 20(a)-20(f), as long as moment vectors D and E rotate to desired positions for measuring the reference current.

In the above descriptions of embodiments of the present invention, it was assumed for convenience that the currents are provided in a manner for moment vectors D and E of the magnetic layers 220 and 222 to rotate clockwise when memory cell 202 is viewed from the top. However, it is to be understood that moment vectors D and E may rotate in both directions. For example, also consistent with the first embodiment of the present invention, a negative digit current may be provided, followed by a positive word current, for moment vectors D and E to successfully rotate counterclockwise. Also consistent with the second embodiment of the present invention, the three current pulses for writing memory cell 202 may include a negative digit current, a positive word current, and a positive digit current provided sequentially. Also consistent with the third embodiment of the present invention, the four current pulses for writing memory cell 202 may include a negative digit current, a positive word current, a positive digit current, and a negative word current provided sequentially.

Also consistent with the fourth embodiment of the present invention, the three pulses may include a negative digit current, a positive word current, and a positive digit current, with the positive word current turned off after the positive digit current.

In the above descriptions, it was assumed that the easy axes $E_+$ and $E_-$ are at an angle of about 45° with the x-axis and y-axis. However, it is to be understood that the easy axes do not have to be at a particular angle with the x-axis and y-axis, but rather may be at any angle with the x-axis or y-axis. One skilled in the art should now appreciate that methods consistent with embodiments of the present invention may be modified accordingly. For example, consistent with the second embodiment of the present invention, when the easy axes of the free magnetic region are at random angles with the word line and digit line, three sequential current pulses may be provided to write a memory cell, where each of the three pulses is a combination of both word current and digit current, rather than word current or digit current alone. For another example, consistent with the third embodiment of the present invention, when the easy axes of the free magnetic region are at random angles with the word line and digit line, four sequential current pulses may be provided to write a memory cell, where each of the four pulses is a combination of both word current and digit current.

It is also to be understood that methods consistent with embodiments of the present invention are applicable not only to memory cells or memory devices having the same structures as memory cell 202 or MRAM device 200, but are also applicable to write MRAM devices in which a memory cell has a free magnetic region comprising a single layer of free magnetic layer or, as noted above, more than three layers.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for writing a memory cell of a magnetoresistive random access memory device, comprising:
    providing a first magnetic field in a first direction;
    providing a second magnetic field in a second direction after providing the first magnetic field, the second direction being substantially perpendicular to the first direction;
    turning off the first magnetic field after providing the second magnetic field;
    providing a third magnetic field in a third direction, the third direction being opposite to the first direction;
    turning off the second magnetic field;
    providing a fourth magnetic field in a fourth direction, the fourth direction being opposite to the second direction;
    turning off the third magnetic field after providing the fourth magnetic field; and
    turning off the fourth magnetic field after turning off the third magnetic field.

2. The method of claim 1, further comprising subjecting the memory cell to a bias magnetic field, wherein
    providing the first magnetic field comprises providing the first magnetic field at an angle greater than 90° with a direction of the bias magnetic field, and
    providing the second magnetic field comprises providing the second magnetic field at an angle smaller than 90° with the direction of the bias magnetic field.

3. The method of claim 1, further comprising subjecting the memory cell to a bias magnetic field, wherein
    providing the first magnetic field comprises providing the first magnetic field at an angle of about 135° with a direction of the bias magnetic field, and
    providing the second magnetic field comprises providing the second magnetic field at an angle of about 45° with the direction of the bias magnetic field.

4. The method of claim 1, wherein the memory cell includes a free magnetic region, a pinned magnetic region, and a tunneling barrier between the free magnetic region and the pinned magnetic region, wherein the pinned magnetic region generates a bias magnetic field in the free magnetic region, the bias magnetic field being in a direction substantially the same as an easy axis of the free magnetic region, and wherein providing the first magnetic field comprises providing the first magnetic field at an angle of about 135° with a direction of the bias magnetic field.

5. The method of claim 1, wherein the memory cell corresponds to a first writing line and a second writing line, the first writing line and the second writing line being substantially perpendicular to each other, and wherein providing the first magnetic field, providing the second magnetic field, providing the third magnetic field, and providing the fourth magnetic field comprise providing currents in the first and second writing lines.

6. The method of claim 1, wherein the memory cell corresponds to a first writing line and a second writing line, the first writing line and the second writing line being substantially perpendicular to each other, and wherein
    providing the first magnetic field comprises providing a first current in the first writing line;
    providing the second magnetic field comprises providing a second current in the second writing line;
    providing the third magnetic field comprises providing a third current in the first writing line; and
    providing the fourth magnetic field comprises providing a fourth current in the second writing line.

7. The method of claim 1, wherein providing the third magnetic field comprises providing the third magnetic field to have a magnitude substantially the same as the first magnetic field.

8. The method of claim 1, wherein providing the fourth magnetic field comprises providing the fourth magnetic field to have a magnitude substantially the same as the second magnetic field.

9. A method for writing a magnetoresistive random access memory (MRAM) device, the MRAM device including a plurality of memory cells each corresponding to one of a plurality of word lines and one of a plurality of digit lines, the method comprising writing one of the memory cells by:
    providing a first magnetic field in a first direction;
    providing a second magnetic field in a second direction after providing the first magnetic field, the second direction being substantially perpendicular to the first direction;
    turning off the first magnetic field after providing the second magnetic field;
    providing a third magnetic field in a third direction, the third direction being opposite to the first direction;
    turning off the second magnetic field;
    providing a fourth magnetic field in a fourth direction, the fourth direction being opposite to the second direction;

turning off the third magnetic field after providing the fourth magnetic field; and turning off the fourth magnetic field after turning off the third magnetic field.

10. The method of claim 9, further comprising subjecting the memory cell to a bias magnetic field, wherein providing the first magnetic field comprises providing the first magnetic field at an angle greater than 90° with a direction of the bias magnetic field, and providing the second magnetic field comprises providing the second magnetic field at an angle smaller than 90° with the direction of the bias magnetic field.

11. The method of claim 9, further comprising subjecting the memory cell to a bias magnetic field, wherein providing the first magnetic field comprises providing the first magnetic field at an angle of about 135° with a direction of the bias magnetic field, and providing the second magnetic field comprises providing the second magnetic field at an angle of about 45° with the direction of the bias magnetic field.

12. The method of claim 9, wherein the one of the memory cells includes a free magnetic region, a pinned magnetic region, and a tunneling barrier between the free magnetic region and the pinned magnetic region, wherein the pinned magnetic region generates a bias magnetic field in the free magnetic region, the bias magnetic field being in a direction substantially the same as an easy axis of the free magnetic region, and wherein providing the first magnetic field comprises providing the first magnetic field at an angle of about 135° with a direction of the bias magnetic field.

13. The method of claim 9, wherein providing the first magnetic field, providing the second magnetic field, providing the third magnetic field, and providing the fourth magnetic field comprise providing currents in the corresponding word line and digit line.

14. The method of claim 9, wherein providing the first magnetic field comprises providing a first current in one of the corresponding word line and digit line;

providing the second magnetic field comprises providing a second current in the other of the corresponding word line and digit line;

providing the third magnetic field comprises providing a third current in the one of the corresponding word line and digit line; and providing the fourth magnetic field comprises providing a fourth current in the other of the corresponding word line and digit line.

15. The method of claim 9, wherein providing the third magnetic field comprises providing the third magnetic field to have a magnitude substantially the same as the first magnetic field.

16. The method of claim 9, wherein providing the fourth magnetic field comprises providing the fourth magnetic field to have a magnitude substantially the same as the second magnetic field.

17. The method of claim 9, further comprising writing other memory cells of the MRAM device.

* * * * *